United States Patent [19]
Paz de Araujo et al.

[11] Patent Number: 6,056,994
[45] Date of Patent: May 2, 2000

[54] LIQUID DEPOSITION METHODS OF FABRICATING LAYERED SUPERLATTICE MATERIALS

[75] Inventors: Carlos A. Paz de Araujo; Larry D. McMillan; Michael C. Scott; Joseph D. Cuchiaro, all of Colorado Springs, Colo.

[73] Assignee: Symetrix Corporation, Colorado Springs, Colo.

[21] Appl. No.: 08/477,111

[22] Filed: Jun. 7, 1995

Related U.S. Application Data

[62] Continuation-in-part of application No. 08/154,927, Nov. 18, 1993, and application No. 07/993,380, Dec. 18, 1992, which is a continuation-in-part of application No. 07/660,428, Feb. 25, 1991, which is a continuation-in-part of application No. 07/690,940, filed as application No. PCT/US89/05882, Dec. 27, 1989, which is a continuation-in-part of application No. 07/290,468, Dec. 27, 1988, said application No. 08/154,927, is a division of application No. 07/965,190, Oct. 23, 1992, which is a continuation-in-part of application No. 07/807,439, Dec. 13, 1991.

[51] Int. Cl.$^7$ .................................................. B05D 5/12
[52] U.S. Cl. ..................... 427/96; 427/226; 427/229; 427/126.3; 427/252; 427/554; 427/421; 427/560; 427/294; 204/192.16
[58] Field of Search ......................... 427/226, 229, 427/126.3, 252, 96, 554, 421, 560, 294; 204/192

[56] References Cited

U.S. PATENT DOCUMENTS

| | | | |
|---|---|---|---|
| 4,752,501 | 6/1988 | Hicks et al. | 427/126.3 |
| 4,792,463 | 12/1988 | Okada et al. | 427/126.3 |
| 4,817,124 | 3/1989 | Ketterson et al. | 378/119 |
| 4,918,051 | 4/1990 | Mantese et al. | 427/226 |
| 4,946,710 | 8/1990 | Miller et al. | 427/226 |
| 4,963,390 | 10/1990 | Lipeles et al. | 427/226 |
| 4,983,577 | 1/1991 | Mantese et al. | 427/226 |
| 4,994,433 | 2/1991 | Chiang | 427/226 |
| 4,997,809 | 3/1991 | Gupta | 427/226 |
| 5,002,928 | 3/1991 | Fukui et al. | 427/226 |
| 5,028,455 | 7/1991 | Miller et al. | 427/226 |
| 5,034,246 | 7/1991 | Mance et al. | 427/126.3 |
| 5,041,420 | 8/1991 | Nagesh et al. | 427/226 |
| 5,053,249 | 10/1991 | Baba et al. | 427/226 |
| 5,106,828 | 4/1992 | Bhargava et al. | 427/226 |
| 5,116,643 | 5/1992 | Miller | 427/226 |
| 5,146,299 | 9/1992 | Lampe et al. | 357/23.5 |
| 5,217,754 | 6/1993 | Santiago-Aviles | 427/226 |
| 5,236,874 | 8/1993 | Pintchowski | 427/126.3 |
| 5,416,063 | 5/1995 | Gross et al. | 427/226 |
| 5,456,945 | 10/1995 | McMillan et al. | 427/252 |

FOREIGN PATENT DOCUMENTS

| | | |
|---|---|---|
| 0415751A1 | 3/1991 | European Pat. Off. . |
| 2-232974 | 9/1990 | Japan . |

OTHER PUBLICATIONS

Lines, et al.; "Principles and Applications of Ferroelectrics & Related Materials"; Clarendon Press, Oxford, 1977 (No Mo.).

Kwak, et al.; "Metalorganic Chemical Vapor Deposition of PbTiO3 Thin Films", Appl. Phys. Letter 53 (18) Oct. 31, 1988.

Vest et al., "Synthesis of Metallo–Organic Compounds for MOD Powders & Films", Mat. Res. Soc. Symp. Proc.,, vol. 60, 1986 Materials Research Soc.

Smolenskii, G.A., et al., "New Ferroelectrics of Complex Composition" Soviet Physics–Technical Physics, 907–908 (1959) (No Mo.).

Melnick, et al.; "Process Optimization & Characterization of Device Worthy Sol–Gel Based PZT for Ferroelectric Memories"; Ferroelectrics 1990, vol. 109 (No Mo.).

*Primary Examiner*—Janyce Bell
*Attorney, Agent, or Firm*—Duft, Graziano & Forest, P.C.

[57] ABSTRACT

A precursor liquid comprising several metal 2-ethylhexanoates, such as strontium, tantalum, and bismuth 2-ethylhexanoates, in a xylenes/methyl ethyl ketone solvent is prepared, and deposited on a substrate. In one embodiment the substrate is placed within a vacuum deposition chamber, the precursor liquid is misted, and the mist is flowed into the deposition chamber while maintaining the chamber at ambient temperature to deposit the precursor liquid on the substrate. In another embodiment, the precursor is spin-coated on the substrate. The liquid is dried, baked, and annealed to form a thin film of a layered superlattice material, such as strontium bismuth tantalate, on the substrate.

37 Claims, 12 Drawing Sheets

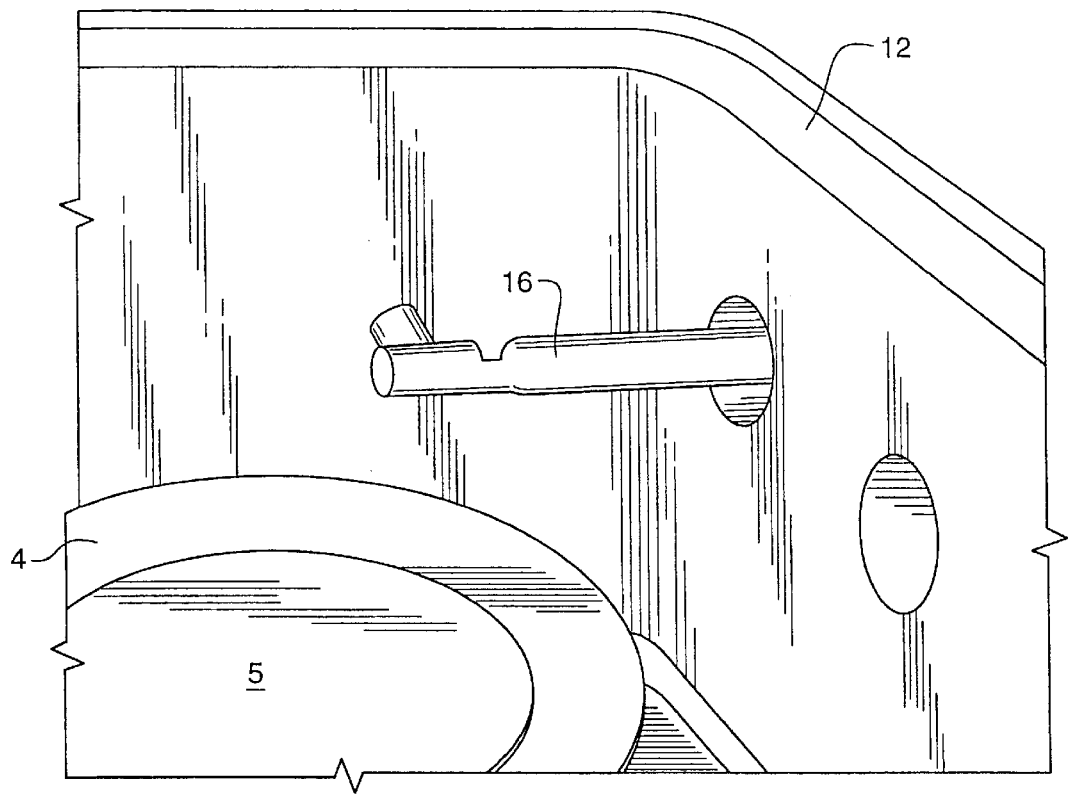
FIG. 17
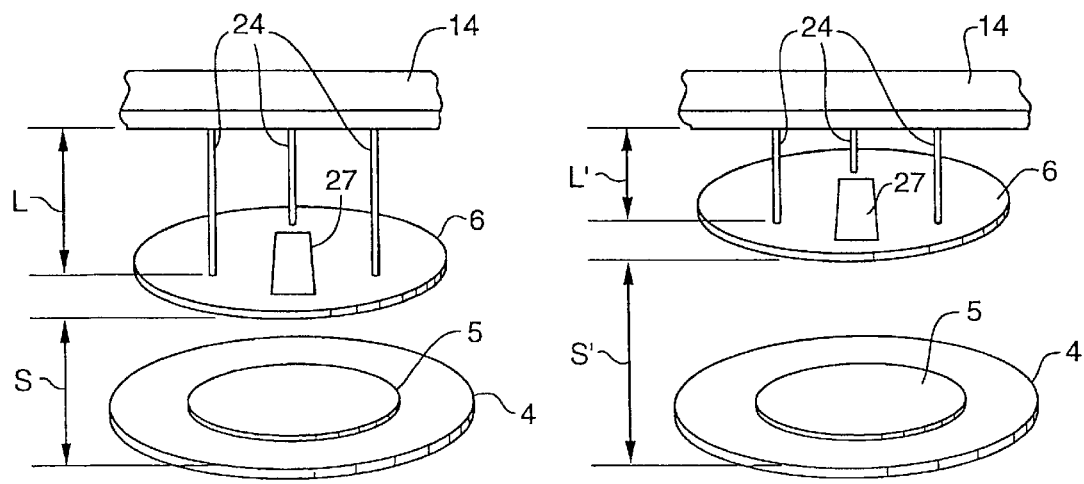
FIG. 18   FIG. 19

LIQUID DEPOSITION METHODS OF FABRICATING LAYERED SUPERLATTICE MATERIALS

This application is a continuation-in-part of U.S. patent application Ser. No. 08/154,927 filed Nov. 18, 1993, which is a divisional application of U.S. patent application Ser. No. 07/965,190 filed Oct. 23, 1992, which is a continuation-in-part of U.S. patent application Ser. No. 07/807,439 filed Dec. 13, 1991; this application is also a continuation-in-part of U.S. patent application Ser. No. 07/993,380 filed Dec. 18, 1992, which is a continuation-in-part of U.S. patent application Ser. No. 07/660,428 filed Feb. 25, 1991, which is a continuation-in-part of U.S. patent application Ser. No. 07/690,940 filed Jun. 17, 1991 based on PCT application US89/05882 filed Dec. 27, 1989, which is in turn a continuation-in-part of U.S. patent application Ser. No. 07/290,468 filed Dec. 27, 1988.

BACKGROUND OF THE INVENTION

1. Field of the Invention

The invention relates to methods for fabricating layered superlattice materials, and in particular a method that produces high quality thin films suitable for forming a portion of an electrical component in an integrated circuit.

2. Statement of the Problem

For about thirty-five years, a class of materials that spontaneously form into layered structures has been known. See Chapter 15 of the book, *Ferroelectrics and Related Materials*, ISSN 0275–9608, (V.3 of the series Ferroelectrics and Related Phenomena, 1984) edited by G. A. Smolenskii, especially sections 15.3–15.7; G. A. Smolenskii, A. I. Agranovskaya, "Dielectric Polarization of a Number of Complex Compounds", *Fizika Tverdogo Tela*, V. 1, No. 10, pp. 1562–1572 (October 1959); G. A. Smolenskii, A. I. Agranovskaya, V. A. Isupov, "New Ferroelectrics of Complex Composition", Soviet Physics—Technical Physics, 907–908 (1959); G. A. Smolenskii, V. A. Isupov, A. I. Agranovskaya, "Ferroelectrics of the Oxygen-Octahedral Type With Layered Structure", *Soviet Physics—Solid State*, V. 3, No. 3, pp. 651–655 (September 1961); E. C. Subbarao, "Ferroelectricity in Mixed Bismuth Oxides With Layer-Type Structure", *J. Chem. Physics*, V. 34, 695 (1961); E. C. Subbarao, "A Family of Ferroelectric Bismuth Compounds", *J. Phys. Chem. Solids*, V. 23, pp. 665–676 (1962). Herein, we refer to the above materials, as well any other materials that can be described by a single chemical formula and which spontaneously form themselves into alternating layers having distinctly different crystalline structure, as layered superlattice materials. The term "layered superlattice material" is selected to distinguish these superlattice materials from alloy type superlattice materials, which are not layered, and superlattice heterostructures, which are inherently not a "material" but rather layered structures made of at least two different materials having different chemical formulae.

Until now, the only known generalized method of making layered superlattice materials as been powder metallurgy. Powder metallurgy methods of producing films involves grinding and mixing of powders, forming a slurry with water or some other carrier, applying the slurry to substrates by spraying, painting or the like, and then firing the applied films at high temperatures such that the carrier is driven off and the particles are melted together to form the desired film. It is impossible to make thin films suitable for use in integrated circuits with this method. It has been attempted to make a few two-metal layered superlattice materials, such as bismuth titanate and magnesium fluoride, using conventional vacuum sputtering, chemical vapor deposition, growing single crystals and sol-gel methods. See for example, S. Y. Wu, "Memory Retention and Switching Behavior of Metal-Ferroelectri-Semiconductor Transistors", *Ferroelectrics*, Vol. 11, pp. 379–383, 1976, U.S. Pat. No. 4,792,463 issued Dec. 20, 1988 to Masaru Okada et al., European Patent Application publication No. 0415 751 A1, published Mar. 6, 1991, and U.S. Pat. No. 5,146,299 issued Sep. 8, 1992 to Donald R. Lampe et al. The Lampe et al. patent also mentions that a sol-gel process may be used to make some materials, which we have called layered superlattice materials (but Lampe et al did not recognize as such), but does not give any examples, and states that the suggestion is based on the demononstration of the sol-gel process to be a viable technique for making high purity, stoicheometric oxide materials, which was work performed by the present inventors and others. See, for example, B. M. Melnick, J. D. Cuchiaro, L. D. McMillan, C. A. Paz De Araujo, and J. F. Scott, "Process Optimization and Characterization of Device Worthy Sol-Gel Based PZT for Ferroelectric Memories", in *Ferroelectrics*, Vol 109, pp. 1–23 (1990). However, conventional sol-gel processing results in materials that crack unpredictably, are too thick, which fatigue, and generally are of insufficient quality for use in integrated circuits. See, "Synthesis of Metallo-organic Compounds for MOD Powers and Films", G. M. Vest and S. Singaram, *Materials Research Society Symposium Proceedings*, Vol. 60,1986 pp. 35–42 and J. V. Mantese, A. L. Micheli, A. H. Hamdi, and R. W. Vest, "Metalorganic Deposition (MOD): A Nonvacuum, Spin-on, Liquid-Based, Thin Film Method", *MRS BULLETIN*, October 1989, and the Melnick article referenced above.

None of these isolated attempts to make materials of suitable quality for a memory indicated that the methods could be used for layered superlattice materials in general, and in fact none even recognized this class of materials. Moreover, none of these methods proved effective enough to actually be applied to making an integrated circuit. Thus, up to now, there has been no effective method for making thin films of layered superlattice materials that are of suitable quality for use in integrated circuits.

The layered superlattice materials having three or more metals, such as strontium bismuth tantalate or strontium bismuth tantalum niobate, are much harder to make than the two-metal layered superlattice materials, such as $BaMF_4$. For example, while single crystals of $BaMF_4$ and other two-metal layered superlattice materials have been grown in many laboratories (see the Lampe et al. patent cited above), no one has yet reported fabrication of a single crystal of any layered superlattice material having three or more metals. Similarly, while several papers have reported making certain two-metal layered superlattice materials by sputtering, no one has reported the fabrication of any layered superlattice materials having three or more metals by sputtering. Since, as will be seen below, layered superlattice materials having three or more metals are much more useful than the two-metal materials, there is an specially significant need for a generalized process by which high-quality layered superlattice materials having three or more metals can be made.

SUMMARY OF THE INVENTION

The present invention fulfills a great need in the art by providing a production worthy process which can be used for easily and economically producing thin films (from a few angstroms to microns in thickness) of layered superlattice materials of suitably high quality for use as ferroelectrics in non-volatile integrated circuit memories, as dielectrics in volatile memories, as insulators, and other applications in integrated circuits.

According to the present invention, there is provided a method of fabricating a layered superlattice material comprising the steps of: providing a substrate, forming a precursor liquid including metal moieties in effective amounts for forming a layered superlattice material, applying the liquid to substrate to form a film of the precursor liquid on the substrate, and treating the liquid layer deposited on the substrate to form a solid film of the layered superlattice material.

In one embodiment the liguid is applied to the substrate by a spin-on process, and in another emodiment the liquid is applied to the substrate by a misted deposition process.

Preferably, the spin-on process is performed at ambient temperature and pressure. Preferably, the misted depostion process is performed in an enclosed deposition chamber at ambient temperature and a slight vacuum.

Preferably the ambient temperature is between about 15° C. and 40° C. In general the ambient temperature may be between about −50° C. and 100° C.

In one embodiment, ultraviolet radiation is applied to the mist and the substrate during deposition.

Preferably, in the misted deposition process, the mist is flowed into the deposition chamber and contained within a small, semi-enclosed space within the deposition area by an adjustable barrier plate located above the substrate. The direction of mist flow is parallel to the substrate, which allows molecular collisions at ambient temperature to effect the coating of a substrate, as opposed to the relatively violent alternatives of using the momentum of the particles or heating the liquid material to force or accelerate the deposition process.

In another embodiment, the misted deposition occurs while applying a DC bias between two parallel plates with the substrate located between them.

It is an object of the present invention to provide highly versatile methods and apparatus having the capability to easily and inexpensively produce almost any layered superlattice material.

It is a further object of the present invention to provide such methods and apparatus having the capability of producing thin films of layered superlattice materials in a wide range of thicknesses, i.e., from a few angstroms to microns in thickness.

It is yet another object of the present invention to provide such methods and apparatus which can deposit high quality thin films of different layered superlattice materials in successive layers.

It is a further object of the present invention to provide a method and apparatus for producing thin films of layered superlattice materials that are of sufficient thinness and quality to form a portion of an electrical component in an integrated circuit.

It is a still further object of the present invention to produce thin films at ambient temperature.

Other objects, advantages and salient features of the present invention will become apparent from the following detailed description which, when taken into conjunction with the annexed drawings, discloses a number of embodiments of the present invention.

BRIEF DESCRIPTION OF THE DRAWING

FIG. 9A is an enlarged view of a portion of FIG. 9;

FIG. 17 is a perspective view showing the placement of the ultraviolet radiation source within the deposition chamber;

FIGS. 18 and 19 illustrate several of the possible positions of the adjustable barrier plate;

DETAILED DESCRIPTION OF THE PREFERRED EMBODIMENTS

Figure 1:
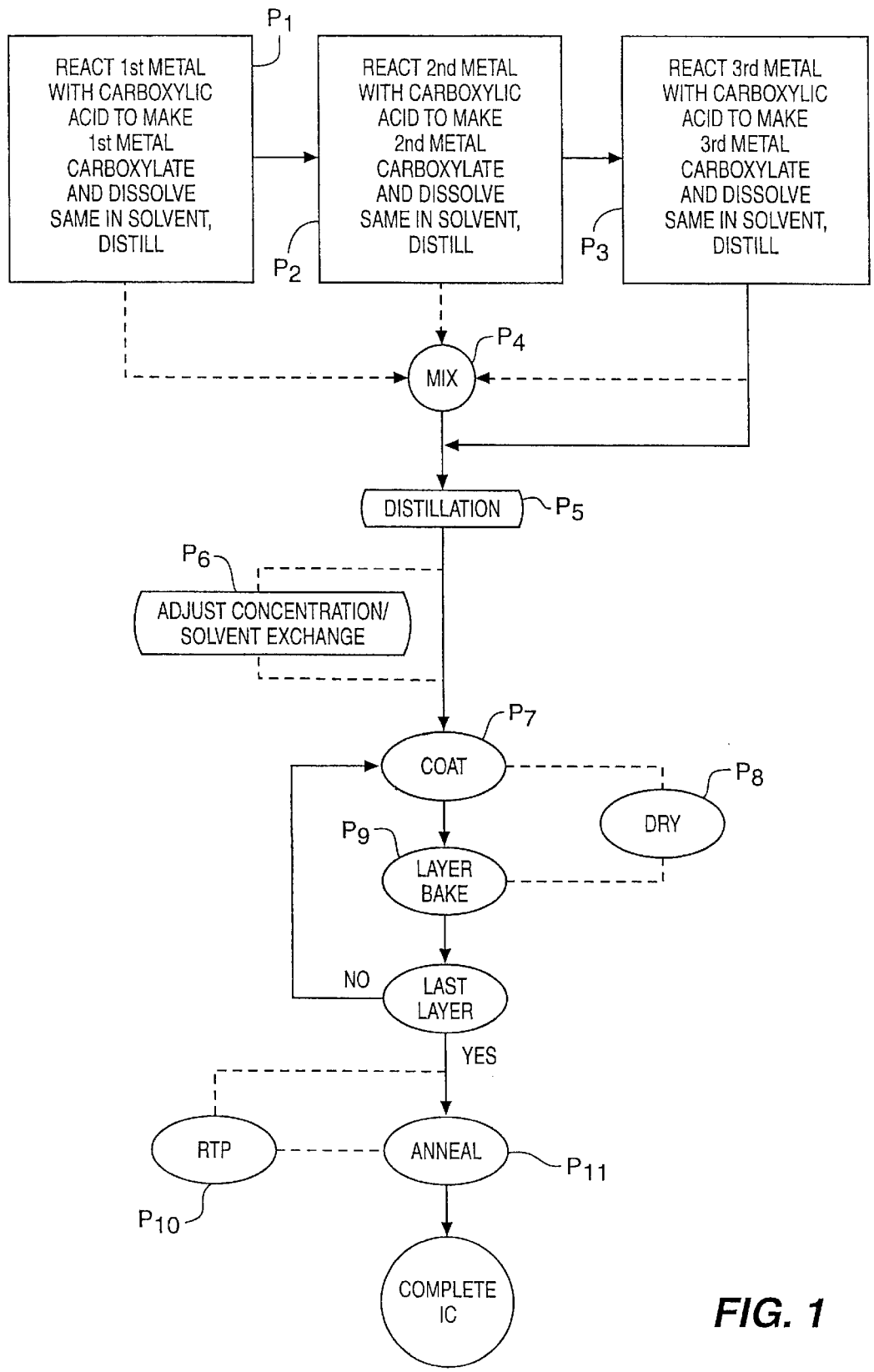
FIG. 1 is a flow chart showing the preferred embodiment of a process for preparing a thin film of the layered superlattice material according to the invention.
Figure 2:
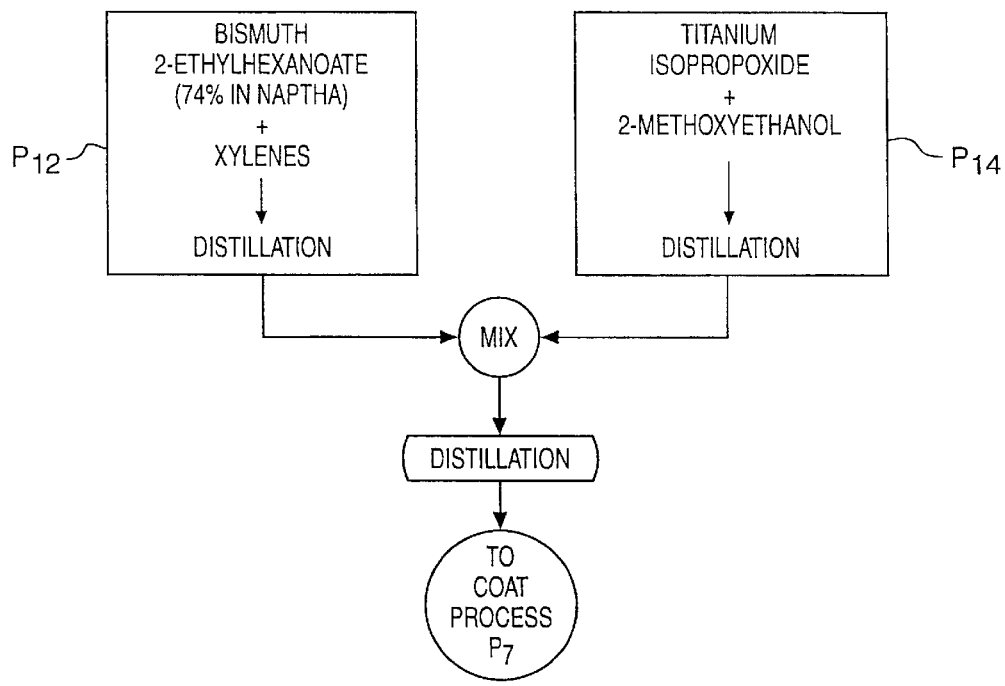
FIG. 2 is a flow chart showing an alternative preferred embodiment of the precursor solution formation portion of the process of FIG. 1.
Figure 3:
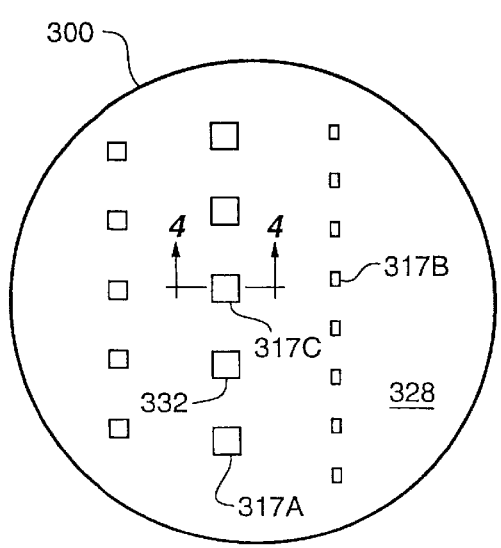
FIG. 3 is a top view of a silicon wafer on which thin film capacitors according to the invention are shown greatly enlarged.
Figure 4:
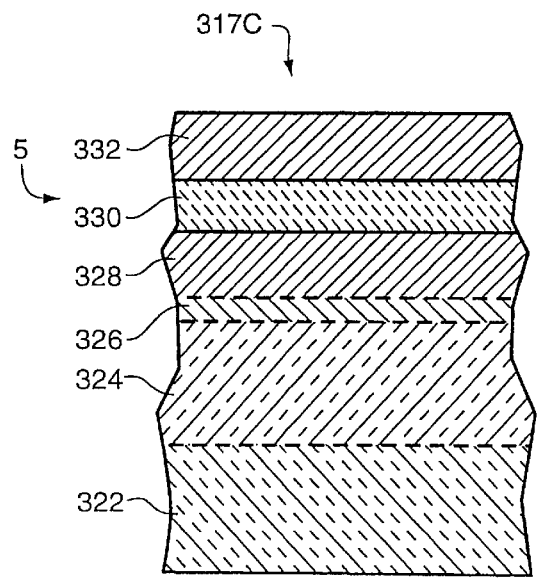
FIG. 4 is a portion of the cross-section of FIG. 3 taken through the lines 4—4, illustrating a thin film capacitor device according to the invention.
Figure 14:
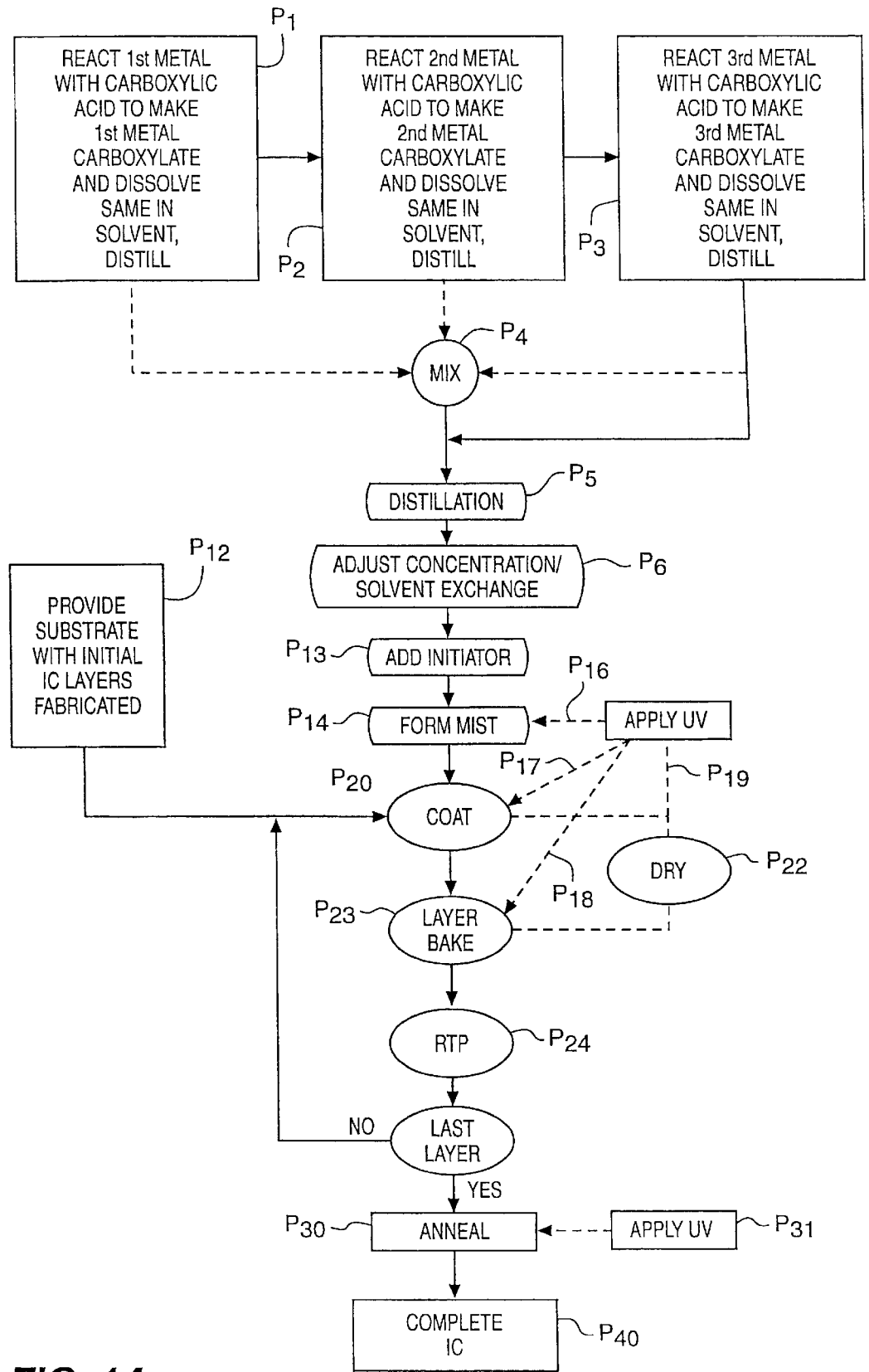
FIG. 14 is a flow chart showing the misted deposition process according to the invention for fabricating a layered superlattice material.

A standardized process by which high quality thin films of any layered superlattice material can be easily made from precursors having a long shelf life is shown in FIGS. 1, 2, and 14. This process is simple and relatively inexpensive, and thus lends itself to large scale manufacturing. Electrical devices that have been fabricated utilizing the process of the invention are shown in FIGS. 3 through 4. We shall first describe the layered superlattice materials, then discuss generally the advantages of using a liguid precursor, then describe the electrical devices briefly, and finally describe the process of the invention, giving numerous examples.

The invention is well-suited for the deposition of high quality thin films of layered superlattice compounds that result in excellent ferroelectric properties, high dielectric constants, low leakage currents, etc. An important parameter of many complex thin films, such as ferroelectric films, is that they are generally required to be quite thin (for example, within a range of 200 angstroms—5000 angstroms). Such film thicknesses can be readily achieved by the process and apparatus according to the invention. The invention can also be used to generate much thicker films, if desired.

As indicated above, a layered superlattice material is defined as a material that can be described by a single chemical formula and which spontaneously forms itself into alternating layers having distinctly different crystalline structure. For example, strontium bismuth tantalate ($SrBi_2Ta_2O_9$) can be considered to be a formed of alternating layers of a crystal structure similar to $Bi_2O_3$ and a crystal structure similar to $SrTa_2O_6$, although it must be kept in mind that $SrTa_2O_6$ has a tungsten bronze structure by itself, but within the layered material it has a perovskite structure. Thus the layered structure is in reality a superlattice in which the structures of the individual sublattices of the perovskite layers and the non-perovskite layers are interdependent. At this time it is believed that these layered materials are natural superlattices, as compared to other superlattices, such as compositional superlattices, which are manufactured or forced superlattices. Thus, term "layered superlattice material" is selected to distinguish these superlattice materials from alloy type superlattice materials, which are not layered, and superlattice heterostructures, i.e. the compositional superlattices, which are inherently not a "material" but rather layered structures made of at least two different materials having different chemical formulae.

The layered superlattice materials made by the process of the invention are polycrystalline. In the polycrystalline state, the structure of the materials includes grain boundaries, point defects, dislocation loops and other microstructure defects. However, within each grain, the structure of the ferroelectric materials is predominately repeatable units containing one or more ferroelectric layers and one or more intermediate non-ferroelectric layers spontaneously linked in a interdependent manner. Thus the layered superlattice materials of the invention which are ferroelectric can be defined as: (A) a material having a localized structure, within a grain or other larger or smaller unit, which localized structure contains predominately repeatable units containing one or more ferroelectric layers and one or more intermediate non-ferroelectric layers spontaneously linked in an interdependent manner. The invention also includes materials that are not ferroelectric, and those that include perovskite-like layers can be included in the following definition: (B) a material having a localized structure, within a grain or other larger or smaller unit, which localized structure contains predominately repeatable units containing one or more perovskite-like layers and one or more intermediate non-perovskite-like layers spontaneously linked in an interdependent manner.

The layered superlattice materials include those materials catalogued by Smolenskii et al. including:

(I) compounds having the formula $A_{m-1}Bi_2M_mO_{3m+3}$, where $A=Bi^{3+}$, $Ba^{2+}$, $Sr^{2+}$, $Ca^{2+}$, $Pb^{2+}$, $K^+$, $Na^+$ and other ions of comparable size, and $M=Ti^{4+}$, $Nb^{5+}$, $Ta^{5+}$, $Mo^{6+}$, $W^{6+}$, $Fe^{3+}$ and other ions that occupy oxygen octahedral; this group includes bismuth titanate, $Bi_4Ti_3O_{12}$;

(II) compounds having the formula $A_{m+1}M_mO_{3m+1}$, including compounds such as strontium titanates $Sr_2TiO_4$, $Sr_3Ti_2O_7$ and $Sr_4Ti_3O_{10}$; and (III) compounds having the formula $A_mM_mO_{3m+2}$, including compounds such as $Sr_2Nb_2O_7$, $La_2Ti_2O_7$, $Sr_5TiNb_4O_{17}$, and $Sr_6Ti_2Nb_4O_{20}$. It is noted that in the case of $Sr_2Nb_2O_7$ and $La_2Ti_2O_7$ the formula needs to be doubled to make them agree with the general formula. Layered superlattice materials include all of the above materials plus combinations and solid solutions of these materials.

Layered superlattice materials may be summarized more generally under the formula:

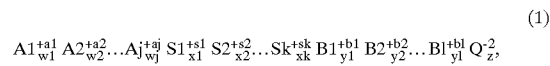

$$A1^{+a1}_{w1} A2^{+a2}_{w2}...Aj^{+aj}_{wj} S1^{+s1}_{x1} S2^{+s2}_{x2}...Sk^{+sk}_{xk} B1^{+b1}_{y1} B2^{+b2}_{y2}...Bl^{+bl}_{yl} Q^{-2}_z, \quad (1)$$

where A1, A2 . . . Aj represent A-site elements in the perovskite-like structure, which may be elements such as strontium, calcium, barium, bismuth, cadmium, lead, and others S1, S2 . . . Sk represent superlattice generator elements, which usually is bismuth, but can also be materials such as yttrium, scandium, lanthanum, antimony, chromium, thallium, and other elements with a valence of +3, B1, B2 . . . Bl represent B-site elements in the perovskite-like structure, which may be elements such as titanium, tantalum, hafnium, tungsten, niobium, zirconium, and other elements, and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the time Sr is the A-site atom and 25% of the time Ba is the A-site atom. If there is only one A-site element in the compound then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include the cases where either or the sites and the superlattice generator can have multiple elements. The value of z is found from the equation:

$$(2) (a1w1+a2W2 \ldots +ajwj)+(s1x1+s2x2 \ldots +skxk)+(b1y1+b2y2 \ldots +bjyj)=2z.$$

Formula (1) includes all three of the Smolenskii type compounds: for the type I material, w1=m−1, x1=2, y1=m, z=3m+3 and the other subscripts equal zero; for the type II material, w1=m+1, y1=m, z=3m+1, and the other subscripts equal zero; for the type III material, w1=m, y1=m, z=3m+2, and the other subscripts equal zero. It is noted that the Smolenskii type I formula does not work for M=Ti and m=2, while the formula (1) does work. This is because the Smolenskii formula does not consider valences. The materials according to the invention do not include all materials that can be fit into formula (1), but rather only those materials that spontaneously form layered superlattices. In summary, the materials of the invention include all the materials as described by the definitions (A) and (B) above, the Smolenskii formulas, and the formula (1), plus solid solutions of all the foregoing materials.

As is common in the art, in this disclosure, the term "substrate" is used in general sense in which it means any one or number of layers 5 (FIG. 4) of material on which a layer of layered superlattice material may be deposited, in addition to a particular sense in which it means the silicon wafer 322 itself. That is, "substrate" is any object on which a layered superlattice material is deposited using the process and apparatus of the invention. As one example other than an integrated wafer, the substrate can be a support for a sputtering target. That is, the layered superlattice material can be formed on a support, to form a sputtering target, which is then used for a sputtering deposition process. The method of the invention has a distinct advantage in making a sputtering target because the target can be made extremely homogeneous.

Precursor liquids include metal-alkoxides in an alcohol solvent, and metal-carboxylates formed by reacting a carboxylic acid, such as n-decanoic acid or 2-ethylhexanoic acid, with a metal or metal compound in a solvent, combinations of alkoxide and carboxylate formulations, as well as other precursor formulations. Metal 2-ethylhexanoates and metal 2-methoxyethoxides appear to be the most useful of these compounds. Unlike most precursors of the prior art, preferably, water is removed from the precursors so that they are essentially anhydrous.

The precursor liquid solution is preferably obtained by preparing precursors for each element using alkoxide chemistry, carboxylic acid chemistry, the combination of alkoxide and carboxylate chemistry, or other wet chemistry techniques, which lead to a common solvent. The solution having that common solvent is preferably used as the sole source for the entire deposition process. However, the invention also contemplates using multiple precursor sources in parallel. In particular, other sources may be used in parallel for doping or modifying the final desired compound. In the preferred precursor liquid, the elements of the desired layered superlattice material to be fabricated are contained in one or more precursor chemical compounds in solution with the common solvent. An example of a precursor formation that may be used for strontium bismuth tantalate, strontium bismuth tantalum niobate, strontium bismuth niobate, and many other layered superlattice materials is illustrated below.

Use of precursor liquids is highly desirable for many reasons. First, the solutions themselves are relatively easy to generate, even for complex layered superlattice material compounds, such as three-metal and four-metal layered superlattice materials. Examples of such precursors are disclosed in U.S. patent application Ser. No. 08/154,760 which is incorporated herein by reference. The precursor liquids used in the present invention are substantially less toxic and easier to handle than the corresponding reactants which are used in conventional, reactive deposition methods as discussed above, thereby allowing the precursor liquids to be handled and processed at substantially lower cost than the corresponding reactants.

The precursor liquids used in the present invention are also stabilized solutions. Here, "stabilized" means that key bonds of the desired layered superlattice material are formed in the process of forming the precursor, and after such formation are stable. This has two aspects. First, the solutions do not react or deteriorate when stored over moderately long periods. Thus the stabilized solutions according to the invention have relatively long shelf lives, which makes the manufacturing process simpler and more efficient. The second aspect of the solutions being stabilized is that bonds formed when forming the precursor remain stable throughout the deposition process and form at least a portion of the bonds in the layered superlattice material in the solid thin film formed on the substrate. For example, a metal-alkoxide may be given by the formula: R—O—M—O—R, where M is the metal, O is oxygen, and R is an alkyl group. When controlled energy is added to the metal alkoxide, the result is a molecule comprising a metal atom bound to an oxygen atom, i.e, a metal oxide, plus alkyl molecules or fragments of alkyl molecules as represented by the equation:

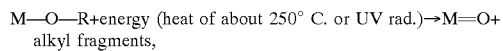

where "=" represents a double bond. In terms of a metal carboxylate, the equation may be written:

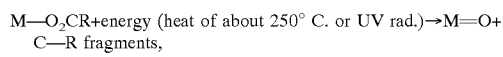

where R is again the alkyl group, M the metal, O is oxygen, and C is carbon. In the preferred embodiment, the precursor is deposited on the substrate and the disassociation of the metal-oxide molecules from the solvent and the alkyl or other fragments takes place on the substrate, although, in the misted deposition process, some of the disassociation may take place in the mist. The removal of the undesired fragments primarily takes place by being pumped out with a vacuum and/or being driven off by heating at a low heat of initially less than about 250° C. Subsequent heating steps take place at higher temperatures, typically a short bake at between 200° C. and 600° C. followed by an rapid thermal process, referred to in the art as RTP or RTA, at between 700° C. and 800° C. Generally after the bake (heating) steps all disassociation is complete. Then follows an anneal process at between about 500° C. and 900° C. which repairs oxygen deficiencies in the film and results in the desired crystal structure, however the basic metal-oxide bonds remain. Thus the metal-oxygen bond in the precursor remains stable and passes through the deposition process to form the metal-oxygen bond of the final desired layered superlattice material compound.

The use of precursor liquids results in high quality thin films because the precursor liquid can be accurately and consistently produced such that the desired layered superlattice material compound after deposition, heating, and anneal, is uniformly, stoichiometrically correct, and because the deposition methods of the present invention do not involve violent chemical or physical reactions which either significantly destabilize the chemical compound of its predetermined molecular formulation or cause non-uniform deposition of the compound, cracking, etc.

During, after, or both during and after deposition, the precursor liquid is treated to form a thin film of solid material on the substrate. In this context, "treated" means any one or a combination of the following: exposed to vacuum, ultraviolet radiation, electrical poling, or drying, heating, baking, rapid thermal processing (RTP or RTA) and annealing. Baking or annealing may be in an oven or on a hot plate, or by use of RTP. In the preferred embodiment of the misted deposition process, UV radiation is applied to the precursor solution during and after deposition. UV may also be used to advantage in the spin-deposition process. The chemistry of the UV enhanced process is not entirely understood. It is believed that the UV assists in disassociating the metal-oxide molecules, or other elements that comprise the desired final chemical compound, from the solvent and the organics or other fragments of the precursor compounds. Electrical poling is also preferably used in the misted deposition process. It is believed the electrical poling increases the dwell time of the mist in the area of the substrate thus increasing the chance of collisions with other mist particles which cause the particles to rebound toward the substrate. After misted deposition, the material deposited on the substrate, which is liquid in the preferred embodiment, is preferably exposed to vacuum for a period. It is believed that exposure to vacuum helps to evaporate the solvent and remove the organics or other fragments that have become disassociated from the elements of the final compound. In both the misted depostion process and the spin-on process, the material is preferably treated by heating, which preferably includes baking, annealing, and the use of rapid thermal processing, know as RTP or RTA. It is believed that the heating removes whatever is left of the solvent, further disassociates the metal-oxide molecules or other elements of the desired compound from the organics or other fragments of the precursor compounds, and drives off the organics. It is believed that after the heating step, the material of the deposited thin film essentially comprises the elements of the final desired chemical compound, though they may not be in the final desired crystal structure. It is believed that the annealing may break up whatever bonds of the precursor chemical compounds that remain and drive off any remaining organics from the precursor compounds, but primarily repairs damaged areas and causes the desired elements to form the final desired crystal structure. However, intermediate chemical compounds, that is compounds that are not either the original precursor chemical compounds nor the final desired chemical compound, may form during the deposition process, the vacuum exposure, the heating, and/or the annealing. The preferred process of the invention is one in which the solution is deposited directly on the substrate and the dissociations and removal of the solvent and organics or other fragments takes place primarily after the solution is on the substrate. However, in another aspect the invention also contemplates a process in which the final desired chemical compound or an intermediate compound is separated from the solvent and organics during the deposition and the final desired chemical compound or an intermediate compound is deposited on the substrate. In both aspects, preferably, one or more bonds of the precursor pass through to the final film.

An exemplary wafer 300 on which test samples of thin-film capacitor devices of integrated circuit quality according to the invention have been fabricated is shown in FIGS. 3 and 4. It should be understood that these figures are not meant to be actual plan or cross-sectional views of any particular portion of an actual capacitor, but are merely idealized representations which are employed to more clearly and fully depict the structure and process of the invention than would otherwise be possible. FIG. 4 shows a cross-section of the wafer 300 of FIG. 3 taken through the line 4—4. Referring to FIGS. 3 and 4, the wafer 300 preferably comprises a P-type silicon substrate 322 on which an approximately 5000 Å silicon dioxide insulating layer 324 has been wet grown. A thin, approximately 200 Å layer 326 of titanium metal has been deposited on the silicon dioxide 324, preferably by sputtering in situ, and a 2000 Å thick electrode of platinum 328 has been deposited on the titanium 326, preferably by sputtering in situ. By "in situ" is meant that both the titanium and the platinum are sputtered without breaking vacuum. The titanium diffuses into the silicon dioxide and platinum and assists the platinum 328 in adhering to the silicon dioxide 324, and is optional. A layer 330 of a layered superlattice material according to the invention is then fabricated via processes that will be described in detail below. Another 2000 Å layer of platinum 332 is then deposited. The wafer 300 is annealed, patterned with a photo-mask process, and etched down to the electrode layer 328 to produce rectangular capacitor devices 317A, 317B, 317C, etc. (FIG. 3) of various sizes separated by large areas of the electrode 328. The size of the devices 317A, 317B, 317C, etc. is greatly exaggerated in FIG. 3. Each device 317A, 317B, 317C etc. may be tested by connecting one lead of the test device to the platinum electrode layer 328 and contacting the other electrode layer 332 of the particular device 317A, 317B, 317C etc. with a fine probe connected to the other lead of the test device. The fabrication of exemplary devices of the types shown in FIGS. 3 and 4 will be described in detail in the examples below.

The preferred process for fabricating a layered superlattice material in which there are three metallic elements is shown in FIG. 1. The process begins by the formation of a liquid precursor. In each of steps P1 through P3 a metal compound is reacted with a carboxylic acid to form a metal carboxylate, which is dissolved in a solvent. The preferred carboxylic acid is one having a medium-length ligand, such as 2-ethylhexanoic acid, although others may be used. Preferably the solvent's boiling point should be within the range 110° C.–170° C. The preferred solvents are alcohols, such as 2-methoxyethanol, aromatic hydrocarbons, such as the xylenes, and esters, such as n-butyl acetate, though any of the solvents in Table A may be used.

TABLE A

| Solvent | Boiling Point |
| --- | --- |
| n-Butyl acetate | (bp = 126.5° C.) |
| N, N-dimethylformamide | (bp = 153° C.) |
| 2-Methoxyethyl acetate | (bp = 145° C.) |
| Methyl isobutyl ketone | (bp = 116° C.) |
| Methyl isoamyl ketone | (bp = 144° C.) |
| Isoamyl alcohol | (bp = 132° C.) |
| Cyclohexanone | (bp = 156° C.) |
| 2-Ethoxyethanol | (bp = 135° C.) |
| 2-Methoxyethyl ether | (bp = 162° C.) |
| Methyl butyl ketone | (bp = 127° C.) |
| Hexyl alcohol | (bp = 157° C.) |
| 2-Pentanol | (bp = 119° C.) |
| Ethyl butyrate | (bp = 121° C.) |
| Nitroethane | (bp = 114° C.) |
| Pyrimidine | (bp = 123° C.) |
| 1, 3, 5 Trioxane | (bp = 115° C.) |
| Isobutyl isobutyrate | (bp = 147° C.) |
| Isobutyl propionate | (bp = 137° C.) |
| Propyl propionate | (bp = 122° C.) |
| Ethyl Lactate | (bp = 154° C.) |
| n-Butanol | (bp = 117° C.) |
| n-Pentanol | (bp = 138° C.) |
| 3-Pentanol | (bp = 116° C.) |

The amounts of the metals used are usually proportioned so that an equivalent weight of each metal equal to the molecular weight of the metal in the stoichiometric formula for the desired layered superlattice material. An exception is lead. Generally an excess of lead of between 1% and 100%, preferably between 3% and 10%, of the equivalent stoichiometric amount is included because lead oxide has a higher vapor pressure than the other metals and a significant amount of lead evaporates as lead oxide during baking and annealing. Similarly, excess amounts of other materials, such as bismuth, thallium, and antimony, that evaporate or otherwise are lost in the process may be used. For bismuth the best results were obtained with between about 2 and 70% excess, and preferrably with between 10 and 50% excess. The preferred amount of excess material depends significantly on the drying and annealing times and temperatures.

The steps P1, P2, and P3 are preferably performed by mixing the metal or other metal compound, such as a metal alkoxide, with the carboxylic acid and the solvent and stirring. Low heat of between about 70° C. and 90° C. may be added to assist the reaction and dissolving, but this is generally not necessary. The solid arrows indicate that generally, the chemist will perform all the steps P1, P2 and P3 in the same container; that is the first metal or metal compound, the first measure of carboxylic acid, and a first solvent are placed in a container, the metal or metal compound and carboxylic acid are reacted, and the reactant dissolved, the second metal or metal compound is then placed in the same container and additional carboxylic acid and solvent are added and stirred to react the second metal or metal alkoxide and dissolve the reactant, then the third metal or metal compound, third carboxylic acid, and third solvent are added, the metal or metal compound is reacted, and the reactant dissolved. In this process the most reactive metal or metal compound is preferably added first, the second most reactive metal or metal compound added second, and the least reactive metal or metal compound added last. It also may be desirable to perform the distillation step after each or some of the metal and/or metal compounds are reacted and dissolved. Alternatively, each metal and/or metal compound may be combined with a carboxylic acid and solvent, reacted, and dissolved in a separate container, the result distilled if desirable, and then the three separate solutions mixed in step P4. Variations and combinations of preparing the individual metal precursors separately or in the same container with or without distillation(s) may be used depending on the solvents used and the form in which metal element is readily available. In addition it should be understood that if the desired superlattice material includes only two metallic elements, then only two metals or metal compounds will be reacted and dissolved, and if the desired superlattice material includes four or more metallic elements, then four or more metals or metal compounds will be reacted and dissolved. Further, it is understood that any of the steps P1, P2, and P3 may be replaced by using a preprepared metal carboxylate.

When the solution of reacted and dissolved metal carboxylates has been prepared, the mixed precursor solution is then distilled in step P5 by heating and stirring the solution to reduce the solution to the desired volume and viscosity, which may depend on whether the solution is to be stored or used immediately, and/or to remove certain liquids. Generally, if it is desirable to remove certain liquids, the solution is heated to a temperature above the boiling point of the liquids to be removed and below the boiling point of the liquids that are desired to be retained. The solution is distilled until all the solvents that are desired to be removed have evaporated and a desired volume and viscosity are reached. Preferably, all water is distilled out so that the final precursor is essentially anhydrous. It may be necessary to add the desired solvent several times in the distilling process to remove all undesired solvents and obtain the desired volume and viscosity.

For those metals for which the metal carboxylates do not yield a good thin film, a variation of the above process is utilized. In this variation preferably a metal alkoxide rather than a metal carboxylate precursor is employed. Preferably an alkoxide is chosen that has a medium-length ligand, so that the precursor has a long shelf life and does not produce precipitates. Preferably, the alkoxide is one that is an effective solvent for the fabricating process, and if it is desired, can easily be replaced by xylenes via the addition of xylene and distillation. As discussed above, 2-methoxyethanol is such an ideal alkoxide. When the precursor includes a metal alkoxide it is especially important that all the water be distilled out of the solution before it is stored.

An example of the above variation of the process of FIG. 1 to produce a bismuth titanate ($Bi_4Ti_3O_{12}$) thin film is shown in FIG. 2. This variation is the same as the precursor solution formation portion of the process of FIG. 1, except that the reaction and dissolving of the titanium in step P14 does not involve a carboxylic acid. In step P14 titanium isopropoxide is reacted with 2-methoxyethanol to produce titanium 2-methoxyethoxide, isopropanol and water, and the isopropanol and water are distilled off. In step P12 the bismuth metal, bismuth carbonate, or bismuth oxide has already been reacted with a carboxylic acid, i.e. 2-ethylhexanoic acid, to form bismuth 2-ethylhexanoate, a metal carboxylate. Bismuth is readily available commercially in this form.

An mixed alkoxide/carboxylate process similar to that in FIG. 2 is used to produce the precursors in several examples below. However, some combination of the processes of FIG. 1 and 2 by using various amounts of 2-ethylhexanoic acid and 2-methoxyethanol in step P14 may also be used to produce bismuth titanate as well as other layered superlattice materials. The 2-methoxyethoxide ligands are more heat sensitive than 2-ethylhexanoate ligands, and the deposition and film shrinkage process may proceed so rapidly that cracking and other defects may occur. Therefore, small amounts of 2-ethylhexanoic acid are added to replace some or all of the 2-methoxyethoxide ligands by 2-ethylhexanoate ligands in the titanium solution just prior to coating. The 2-ethylhexanoate ligands are less thermally sensitive and slow down the deposition and thermal decomposition process, usually producing better results.

Another aspect of the invention involves the technique of solvent exchange. Many times a compound X will dissolve in one particular solvent only and no other solvent. Similarly, a compound Y may dissolve in a different solvent and the solvent for compound X is not compatible with the solvent for compound Y. Or the best solvents for dissolving the precursor compounds may not be the same as the best solvents for spinning, for forming a mist, or for wetting the substrate and forming physically sound thin films. Solvent exchange is used to produce a precursor having compounds X and Y in a common solvent. That common solvent is preferably the solvent to which the system may be tuned; i.e. a solvent that readily forms mists, a solvent that is particularly tailored for the correct vapor pressure for flowing the precursor through the valves and system tubing, etc., while reducing clogging of the system from precursor residue, a solvent that readily wets the substrate and forms physically sound thin films. Generally, solvent exchange comprises adding the common solvent, or simply a different solvent than the initial solvent, and distilling away the other solvent or solvents. To remove the undesired solvents from a solution, the solution is heated above the boiling point of the solvents to be removed and below the boiling point of the solvent or solvents that are desired to be retained. For example, if a xylene solvent is desired, xylene is added to a given solution, and the other solvents are distilled away until the desired volume and viscosity are reached. In general a xylene exchange is performed in preparing the precursor solution if the spin coating method is used. As further examples, n-butyl acetate may be added just before the deposition process to provide a final precursor that is especially tuned to the deposition process for strontium bismuth tantalate and strontium bismuth tantalum niobate.

In step P7 the precursor solution is then applied to a wafer, such as the wafer 300 in FIG. 3, with the substrate 322 and the layers 324, 326, and 328 already formed at the time of coating in step P7 to form layer 330. Preferably the coating step P7 may be either be a spin deposition as used in Examples 1 through 6 below or a misted deposition at ambient temperature in a vacuum as used in Examples 7 through 10 below. The spin depostion process will be described first.

2. Spin Deposition Process

In spin deposition the precursor is placed on a wafer 300 and the wafer is spun to evenly distribute the precursor over the wafer. Preferably the wafer is spun at a spin rate of between 750 RPM and 6000 RPM for a period of 5 seconds to a minute, with these parameters depending on the concentration and viscosity of the solution being applied and the desired thickness of the resulting layer. After the coating process, the wafer 300 is transferred to a hot plate in which it is baked as indicated at P9. Alternatively, an oven may be used in the baking if it is desirable to control ambients. Preferably, the baking is at a temperature in the range of 200° C. and 400° C. for a time period between 30 seconds and 15 minutes. Optionally, a drying step P8 may be preformed between the coating and bake steps. The drying will generally comprise a heating on a hot plate or in an oven for from about 30 seconds to a few minutes at a lower temperature than the bake step. Preferably, the drying is performed at about 150° C. If the initial coating and bake steps do not result in a layer, such as 330 in FIG. 4, that is as thick as desired, then the coating P7, optionally the drying step P8, and the baking step P9 are repeated until the desired thickness is obtained. After the last layer is coated and baked, the wafer is placed in a diffusion furnace and the layered superlattice material is annealed at step P11. Preferably, the annealing is performed in an oxygen atmosphere at ambient pressure with a flow rate of about 3 liters to 6 liters per minute, and at a temperature of between 600° C. and 850° C. for a time period of between 5 minutes and three hours. The temperature is preferably ramped upward in steps over this period. Optionally, the wafer may be annealed in a rapid thermal process (RTP) step P10 prior to the diffusion furnace anneal step P11. The RTP step utilizes a halogen light source to raise the wafer 300 rapidly to a high temperature in the range from 500° C. to 850° C. for an anneal time of between 15 seconds and 3 minutes. After the annealing P11, the rest of the wafer 300 is completed.

Six examples of the process of fabricating a layered superlattice material and capacitor devices as shown in FIGS. 3 and 4 are given below. Each is preceded by a table listing the reactive components utilized in the fabrication process and each is followed by a description of the ferroelectric and/or the dielectric properties as appropriate. The solvents used are described in a description of the process following each table. In the tables, "FW" indicates formula weight, "g" indicates grams, "mmoles" indicates millimoles, and "Equiv." indicates the equivalent number of moles in solution. "Xylenes" indicates a commercially available xylene solution which includes three different fractionations of xylene. Bismuth 2-ethylhexanoate indicates a commercially available bismuth solution of bismuth 2-ethylhexanoate in 74% naphtha; the formula weight in this case is placed in parenthesis to indicate that it is an equivalent formula weight of bismuth in the solution as a whole, rather than the formula weight of the just the bismuth 2-ethylhexanoate, in order to take into account the presence of the naphtha. All processes were performed at the atmospheric pressure in Colorado Springs, Colo., except where otherwise noted. In the examples below, all the initial wafer substrates on which the materials described were fabricaed were layered substrates as illustrated by layers 322, 324, 326, and 328 in FIG. 4, with the silicon substrates 322 being made of P-type silicon of between 5 Ohms/cm and 25 Ohms/cm resistivity, having a field oxide layer 324 that was wet grown to about 5000Å a 200 Å thick layer 326 of sputtered titanium, and a 2000 Å layer 328 of sputtered platinum. After the layers 330 and 332 were deposited as described in the examples, the wafer 300 was patterned as illustrated in FIG. 3 using either a positive or negative photo resist in combination with a photo mask step. When a positive photo resist is indicated in an example, the resist is spun on at 5000 RPM, soft-baked on a hot plate at 95° C. for 2 minutes, followed by a standard photo mask process having a 7 second UV exposure, a 1 minute development and 1 minute water rinse, and a 5 minute hard bake at 140° C. When a negative photo resist is indicated in an example, the negative resist is spun on at 5000 RPM, soft-baked on a hot plate at 90° C. for 5 minutes, followed by a standard photo mask process utilizing a 4 second UV exposure, a 1 minute development and 1 minute water rinse, and a 5 minute hard bake at 140° C. When an IPC strip is indicated, this is an oxygen plasma strip using an Ion Plasma Corporation "barrel etcher" at 500 mTorr oxygen and 350 watts. When an rapid thermal process (RTP) is indicated, the process was done with an AG Associates model 410 Heat Pulser, the ramp rate given is for the period of increasing the temperature to the working temperature, and the time period given is the time for which the temperature was held at the working temperature. In all cases an oxygen flow of 3 liters/minute is used in the RTP anneals.

Figure 7:
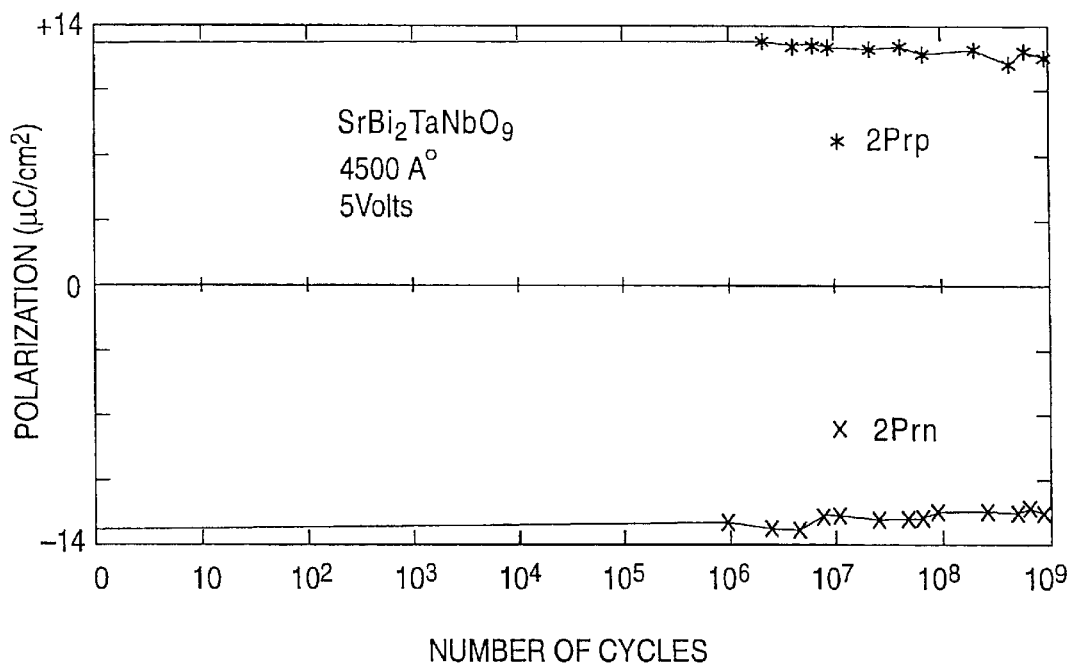
FIG. 7 is a graph of 2Prp and 2Prn versus number of switching cycles for a ferroelectric capacitor as shown in FIG. 4 utilizing $SrBi_2TaNbO_9$ as the ferroelectric material.
Figure 8:
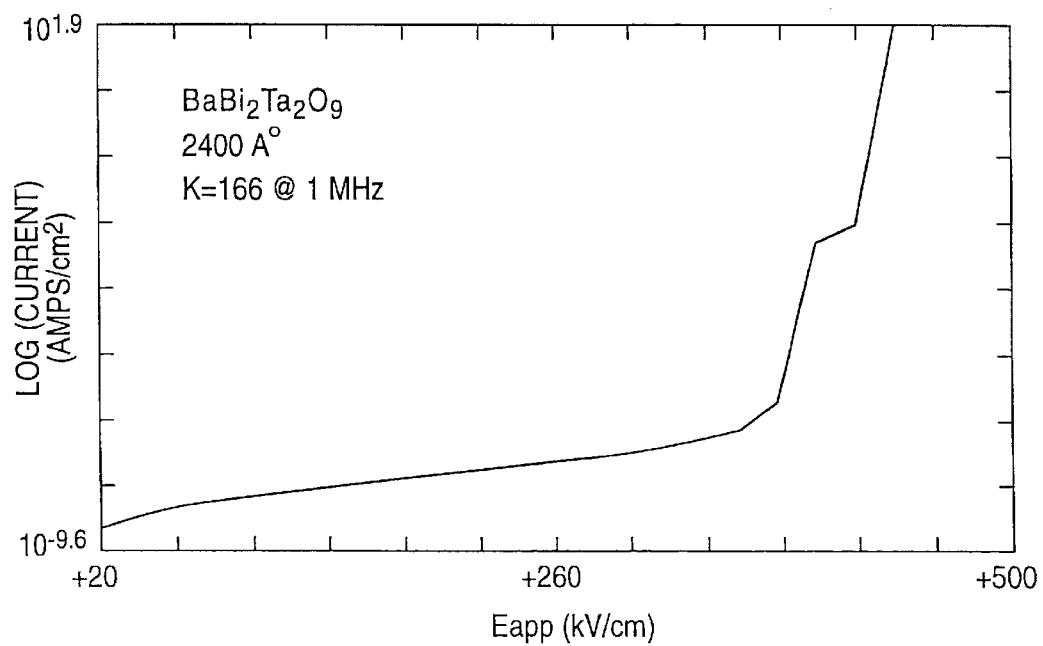
FIG. 8 is a graph of the logarithm of the DC leakage current versus applied field for a capacitor as shown in FIG. 4 utilizing $BaBi_2Ta_2O_9$ as the high dielectric constant material.

In each of the examples, following the description of the process of making the device with the particular material, there is a discussion of the electrical properties illustrated in the figures. In each figure, the material of the sample, the thickness of the sample, and other relevant parameters are given. The thickness is usually approximate since, as in all layering type processes, the thickness can vary, and it was not measured for each portion of the wafer 300. For some samples, the given thickness is based on the known thickness that results from the processing parameters; the measurements of thickness that were done confirmed that the thicknesses did not vary sufficiently from that determined from the process parameters to alter the results significantly. The figures include hysteresis curves, such as FIG. 5, material endurance or "fatigue" curves such as FIGS. 6 and 7, and leakage current curves, such as FIG. 8. The hysteresis curves are given in terms of the applied electric field in kilovolts per centimeter versus the polarization in microcoulombs per centimeter squared. As is well-known, hysteresis curves which suggest good ferroelectric properties tend to be relatively boxy and long in the direction of polarization, the ordinate in the figures herein. The hysteresis measurements were all made on an uncompensated Sawyer-Tower circuit unless otherwise noted. The endurance or "fatigue" curves give the polarization, Prp and Prn, in microcoulombs per square centimeter versus the number of cycles. These curves are taken from the polarizabilities measured in a PUND switching test. The leakage current curve, FIG. 8, is given in terms of the applied electric field in kilovolts per centimeter as the abscissa versus the log of the current in amps per square centimeter. It is necessary to use the log of current because the curves are measured over an extremely wide range of currents. A leakage current of $10^{-6}$ amps per square centimeter or less is considered excellent for dielectric applications. However, it should be kept in mind that for a given material the leakage current can be decreased simply by making the material thicker, and will be increased if the material is made thinner. Thus the thickness of the material on which the measurement is made must be considered. In state-of-the-art high-density CMOS integrated circuits, the dielectric layers range from about 100 Å for the capacitor dielectric in DRAM capacitors to about 15,000 Å for passivation layers.

EXAMPLE 1

Strontium Bismuth Tantalate—$SrBi_2Ta_2O_9$

The compounds shown in Table I were measured.

TABLE I

| Compound | FW | g | mmole | Equiv. |
| --- | --- | --- | --- | --- |
| Tantalum ethoxide | 406.26 | 4.9553 | 12.197 | 2.0000 |
| 2-ethylhexanoic acid | 144.21 | 8.7995 | 61.019 | 10.006 |
| Strontium | 87.62 | 0.5330 | 6.0831 | 0.9975 |
| 2-ethylhexanoic acid | 144.21 | 1.7613 | 12.213 | 2.0026 |
| Bismuth 2-ethylhexanoate | (862.99) | 10.525 | 12.196 | 1.9998 |

The strontium was combined with the first measure of 2-ethylhexanoic acid and 80 ml 2-methoxyethanol. The mixture was stirred on low heat of between about 70° C. and 90° C. to hurry the reaction rate. When all the strontium was reacted and the solution had cooled to approximately room temperature, the tantalum ethoxide followed by the second measure of 2-ethylhexanoic acid were added. The mixture was stirred and heated to a maximum temperature of 115° C. to distill out ethanol and water. Then 75 ml xylenes followed by the bismuth 2-ethylhexanoate were added. The solution was stirred and heated with a maximum temperature of about 125° C. until only 60.0 ml of solution remained. The concentration was 0.102 moles of $SrBi_2Ta_2O_9$ per liter. The wafer was baked at 140° C. in air for 30 minutes to dehydrate it. An eyedropper was used to place 1 ml of the $SrBi_2Ta_2O_9$ solution on a wafer 300 as in FIG. 4 with the layers deposited up to and including the platinum bottom electrode 328. The wafer was spun at 1500 RPM for 20 seconds. The wafer was then placed on a hot plate and baked at about 250° C. in air for three minutes. The steps from using an eyedropper to deposit solution on the wafer through baking on the hot plate were repeated for another layer. The wafer was then transferred to a diffusion furnace and annealed at 750° C. in an oxygen flow of 5 l/m for 2 hours. The top layer 332 of 2000 Å platinum was sputtered, a resist was applied, followed by a standard photo mask process, an ion mill etch, an IPC strip and a final contact anneal at 750° C. in an oxygen flow of 5 l/m for 30 minutes. The resulting sample was tested with the results shown in FIGS. 5 and 6.

Figure 5:
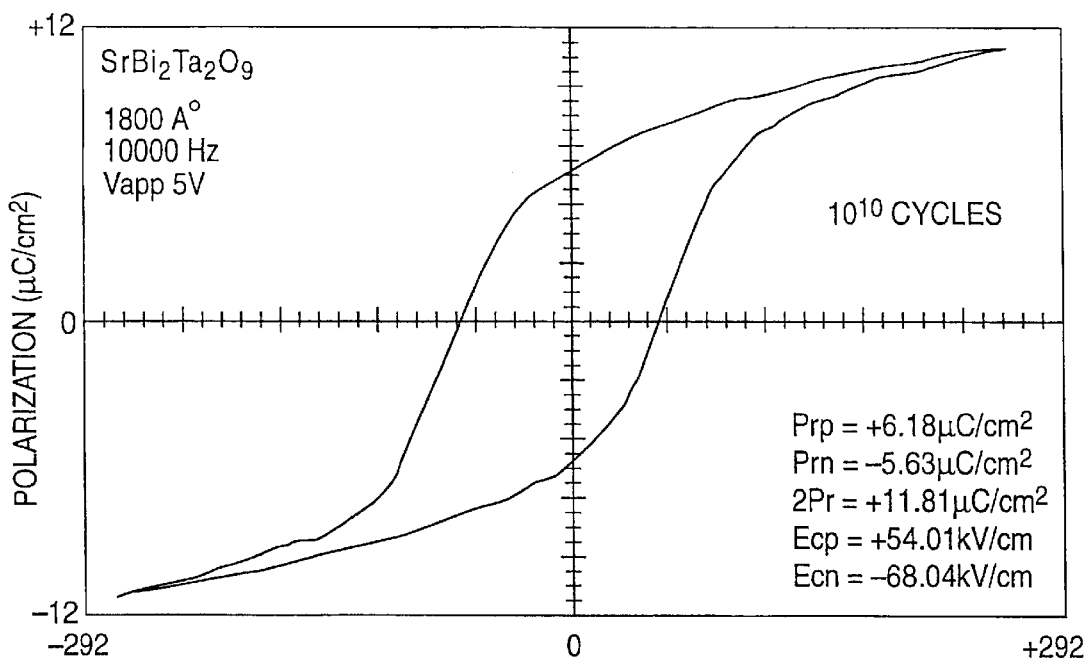
FIG. 5 is a hysteresis curve after $10^{10}$ cycles for a ferroelectric capacitor as shown in FIG. 4 utilizing $SrBi_2Ta_2O_9$ as the ferroelectric material.
Figure 6:
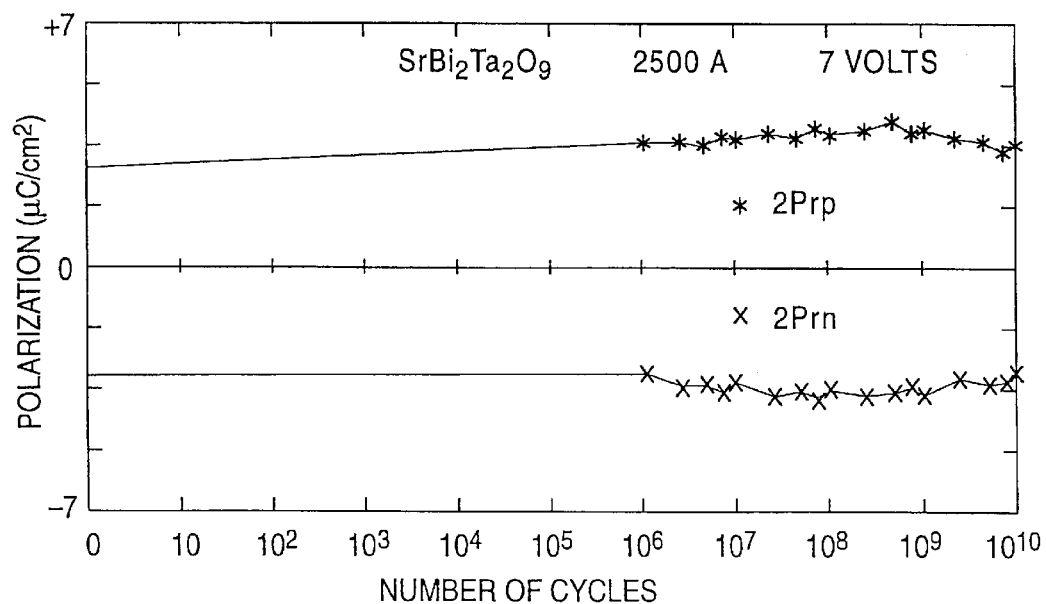
FIG. 6 is a graph of 2Prp and 2Prn versus the number of switching cycles for the same sample used in FIG. 5.

FIG. 5 shows the hysteresis curve for the sample after $10^{10}$ cycles. The curve is boxy vertical showing good ferroelectric properties and is little changed from the initial hysteresis curve) not shown, demonstrating low-fatigue. FIG. 6 shows a graph of 2Prp and 2Prn over $10^{10}$ cycles, derived from a PUND switching test. This curve shows negligible fatigue over the entire $10^{10}$ cycles. These results are phenomenal when compared to the prior art materials, and indicate that this layered superlattice material would last indefinitely in a ferroelectric switching memory.

In more recent samples a precursor solution in xylenes as described above with a concentration of 0.2 moles $SrBi_2Ta_2O_9$ was diluted to 0.13 moles with n-butyl acetate and then spun onto the wafer and processed as described above. The resulting film was smoother and more uniform than previous films of the same material. Also sample capacitors made in a process as described in Example 1 above, except that 10% excess bismuth was used in the precursor solution and other process parameters were more carefully controlled to ensure better stoichiometry, yield hysteresis curves even boxier and more vertical than the curve of FIG. 5, indicating even better ferroelectric switching performance. Moreover, the hysteresis curves for four different voltages all nearly overlaped, with the curves for the higher voltages simply extending out further along approximately the same line. This feature holds great significance for practical integrated circuit devices, since it means that even if the voltage changes substantially from specifications, as often happens in the real world, the device performance will not change significantly. The value of 2Pr for two of these sample were 23.39 and 25.06 microcoulombs per $cm^2$ respectively.

EXAMPLE 2

Strontium Bismuth Niobate—$SrBi_2Nb_2O_9$

The compounds shown in Table II were measured.

TABLE II

| Compound | FW | g | mmole | Equiv. |
| --- | --- | --- | --- | --- |
| strontium | 87.62 | 0.5625 | 6.4198 | 1.0000 |
| 2-ethylhexanoic acid | 144.21 | 2.0940 | 14.520 | 2.2618 |
| bismuth 2-ethylhexanoate | (862.99) | 11.079 | 12.838 | 1.9998 |
| niobium butoxide | 458.48 | 5.8862 | 12.839 | 1.9999 |
| 2-ethylhexanoic acid | 144.21 | 9.2911 | 64.428 | 10.036 |

The strontium was placed in 30 ml 2-methoxyethanol. The first measure of 2-ethylhexanoic acid was added and was allowed to react completely. The bismuth 2-ethylhexanoate was added, followed by 35 ml xylenes. The niobium butoxide and second measure of 2-ethylhexanoic acid was added, followed by 40 ml of xylenes. The mixture was heated and stirred, with a maximum temperature of 123° C., until all the butanol, water, and 2-methoxyethanol were removed. The final volume was 63 ml, and the final mass was 57.475 g. The concentration was 0.102 moles of $SrBi_2Nb_2O_{9per}$ liter, or 0.1117 mmoles of $SrBi_2Nb_2O_9$ per gram of solution. The wafer was baked at 140° C. in air for 30 minutes to dehydrate it. An eyedropper was used to place 1 ml of the $SrBi_2Nb_2O_9$ solution on a wafer as in FIG. 4 with the layers deposited up to and including the platinum bottom electrode 328. The wafer was spun at 1000 RPM for 20 seconds. The wafer was then placed on a hot plate and baked at 230° C. in air for two minutes and 30 seconds. The steps from using an eyedropper to deposit the $SrBi_2Nb_2O_9$ solution on the wafer through baking on the hot plate were repeated for another layer. The wafer was then transferred to a diffusion furnace and annealed at 750° C. in an oxygen flow of 5 l/m for 40 minutes. The top layer 332 of 2000 Å platinum was sputtered, a negative resist was applied followed by a standard photo mask process, an ion mill etch, an IPC strip and a final contact anneal at 750° C. in an oxygen flow of 5 l/m for 30 minutes. The resulting sample was tested. The sample was an excellent ferroelectric for a memory and was a relatively "fast" switching material. A graph of 2Prp and 2Prn versus number of switching cycles showed much lower fatigue than prior art materials, but not as low as that for strontium bismuth tantalate ($SrBi_2Ta_2O_9$) in FIG. 6, although it is possible that the difference in the fatigue is due to less than optimum processing on this particular sample.

EXAMPLE 3

Strontium Bismuth Tantalum Niobate—
$SrBi_2TaNbO_9$

The compounds shown in Table III were measured.

TABLE III

| Compound | FW | g | mmole | Equiv. |
|---|---|---|---|---|
| strontium | 87.62 | 0.5821 | 6.6435 | 1.0001 |
| 2-ethylhexanoic acid | 144.21 | 1.9770 | 13.709 | 2.0635 |
| bismuth 2-ethylhexanoate | (862.99) | 11.4687 | 13.289 | 2.0005 |
| tantalum butoxide | 546.522 | 3.6303 | 6.6426 | 1.0000 |
| niobium butoxide | 458.48 | 3.0456 | 6.6428 | 1.0000 |
| 2-ethylhexanoic acid | 144.21 | 9.6081 | 66.626 | 10.030 |

The strontium was placed in 30 ml of 2-methoxyethanol and the first measure of 2-ethylhexanoic acid was added and allowed to react completely. Then the bismuth 2-ethylhexanoate was added followed by 40 ml xylenes. The tantalum butoxide and the niobium butoxide were added, followed by the second portion of the 2-ethylhexanoic acid and 40 ml additional xylenes. The mixture was stirred and heated to a maximum temperature of 122° C. to distill out all water, butanol and 2-methoxyethanol until 65 ml of solution remained. The concentration was 0.102 moles of $SrBi_2TaNbO_9$ per liter. The wafer was baked at 140° C. in air for 30 minutes to dehydrate it. An eyedropper was used to place 1 ml of the $SrBi_2TaNbO_9$ solution on a wafer as in FIG. 4 with the layers deposited up to and including the platinum bottom electrode 328. The wafer was spun at 1000 RPM for 20 seconds. The wafer was then placed on a hot plate and baked at 250° C. in air for five minutes. The wafer was placed in a rapid thermal processor and annealed for 30 seconds in an oxygen flow of 3 l/m at a temperature of 700° C. with a 125°/sec ramp rate. The steps from using an eyedropper to place $SrBi_2TaNbO_9$ solution on the wafer through the RTP were repeated for another layer. The wafer was then transferred to a diffusion furnace and annealed at 750° C. in an oxygen flow of 5 l/m for 2 hours. A top layer 332 of 2000 Å platinum was sputtered, a positive resist was applied, followed by a standard photo mask process, an ion mill etch, an IPC strip and a final contact anneal at 750° C. in an oxygen flow of 5 l/m for 30 minutes. The resulting sample was tested with some of the results shown in FIG. 7.

The material was also an excellent ferroelectric for memory purposes and having fast switching. FIG. 7 shows the curves of 2Prp and 2Prn versus switching cycles. While this shows a little more fatigue than the same curves for $SrBi_2Ta_2O_9$ (FIG. 6), still the results must be considered to be phenomenal as compared to prior art materials. There is only about 5% fatigue over $10^9$ cycles, which is ten times better than even the best materials in the prior art. The results show that $SrBi_2TaNbO_9$ should provide non-volatile ferroelectric memories that last indefinitely.

More recent tests in strontium bismuth tantalate and strontium bismuth tantalum niobate samples made with 10% to 20% excess bismuth have shown essentially no fatigue out to $10^{12}$ cycles, which is nearly a million times better than the best prior art materials.

EXAMPLE 4

Barium Bismuth Tantalate—$BaBi_2Ta_2O_9$

The compounds shown in Table IV were measured.

TABLE IV

| Compound | FW | g | mmole | Equiv. |
|---|---|---|---|---|
| barium | 137.327 | 0.9323 | 6.7889 | 1.0000 |
| 2-ethylhexanoic acid | 144.21 | 1.9733 | 13.684 | 2.0156 |
| bismuth 2-ethylhexanoate | (862.99) | 11.717 | 13.577 | 1.9999 |
| tantalum butoxide | 546.522 | 7.4211 | 13.579 | 2.0002 |
| 2-ethylhexanoic acid | 144.21 | 9.9216 | 68.800 | 10.134 |

The barium was placed in 40ml of 2-methoxyethanol and 20 ml of toluene, to slow the reaction, and the first measure of 2-ethylhexanoic acid were added and allowed to react completely. Then the bismuth 2-ethylhexanoate was added followed by 40 ml xylenes. The solution was stirred and heated to a maximum temperature of about 123° C. to distill out water, the toluene and the 2-methoxyethanol. The solution was allowed to cool to room temperature, then the tantalum butoxide was added, followed by the second portion of the 2-ethylhexanoic acid and 40 ml additional xylenes. The mixture was heated to a temperature of about 123° C. while stirring to distill out the butanol until 66 ml of solution remained. The concentration was 0.103 moles of $BaBi_2Ta_2O_9$ per liter. The wafer was baked at 140° C. in air for 30 minutes to dehydrate it. An eyedropper was used to place 1 ml of the $BaBi_2Ta_2O_9$ solution on a wafer as in FIG. 4 with the layers deposited up to and including the platinum bottom electrode 328. The wafer was spun at 1000 RPM for 20 seconds. The wafer was then placed on a hot plate and baked at 250° C. in air for five minutes. The wafer was placed in a rapid thermal processor and annealed for 30 seconds in an oxygen flow of 3 l/m at a temperature of 700° C. with a 125°/sec ramp rate. The steps from using an eyedropper to place $BaBi_2Ta_2O_9$ solution on the spinner to the RTP were repeated for another layer. The wafer was then transferred to a diffusion furnace and annealed at 750° C. in an oxygen flow of 5 l/m for 2 hours. A top layer 332 of 2000 Å platinum was sputtered, a positive resist was applied, followed by a standard photo mask process, an ion mill etch, an IPC strip and a final contact anneal at 750° C. in an oxygen flow of 5 l/m for 30 minutes. The resulting sample was tested with the results shown in FIG. 8.

The $BaBi_2Ta_2O_9$ was not a switching ferroelectric, but was a paraelectric with a dielectric constant of 166 at 1 megahertz. This is a very high dielectric constant as compared to the dielectric constant of 3.9 for silicon dioxide, the most commonly used dielectric in integrated circuits. FIG. 8 shows the leakage current curve for $BaBi_2Ta_2O_9$. At low voltages, the leakage current is negligible, of the order of $10^{-10}$ amps/cm2. Over the range of voltages uses in conventional integrated circuits, i.e. 1–10 volts, the leakage current across the 2400 Å sample remains below about $10^{-8}$ amps/cm$^2$, which is still very small. The thickness of this sample is about the same thickness generally used for dielectrics in conventional integrated circuits. These results show that this material will be an excellent high dielectric material in integrated circuits. Moreover, none of the elements of which the material is composed create compatibility problems with conventional integrated circuit materials. In addition $BaBi_2Ta_2O_9$ should be much more resistant to radiation damage than conventional dielectrics because, except for the oxygen, the elements out of which is compounded are heavier than the elements such as silicon and nitrogen out of which conventional integrated circuit dielectrics are composed.

EXAMPLE 5

Lead Bismuth Tantalate—$PbBi_2Ta_2O_9$

The compounds shown in Table V were measured.

TABLE V

| Compound | FW | g | mmole | Equiv. |
|---|---|---|---|---|
| Lead 2-ethylhexanoate in xylenes | (1263.6) | 16.691 | 13.209 | 1.1000 |
| bismuth 2-ethylhexanoate | (753.35) | 18.095 | 24.019 | 2.0002 |
| tantalum butoxide | 546.52 | 13.126 | 24.017 | 2.0001 |
| 2-ethylhexanoic acid | 144.21 | 17.967 | 124.59 | 10.375 |

The lead 2-ethylhexanoate in xylenes previously prepared stock solution and the bismuth 2-ethylhexanoate were combined, followed by 40 ml xylenes. Then the tantalum butoxide was added, followed by the 2-ethylhexanoic acid. The mixture was stirred on low heat of between about 70° C. and 90° C. for four hours, then raised to a maximum temperature of 114° C. to distill out the butanol until 66 ml of solution remained. The concentration was 0.172 moles of $PbBi_2Ta_2O9$ per liter with 10% excess lead. The wafer was baked at 140° C. in air for 30 minutes to dehydrate it. An eyedropper was used to place 1 ml of the $PbBi_2Ta_2O_9$ solution on a wafer as in FIG. 4 with the layers deposited up to and including the platinum bottom electrode 328. The wafer was spun at 1000 RPM for 20 seconds. The wafer was then placed on a hot plate and baked at 375° C. in air for two and a half minutes. The steps from using an eyedropper to place the $PbBi_2Ta_2O_9$ solution on the wafer through baking were repeated for another layer. The wafer was then transferred to a diffusion furnace and annealed at 750° C. in an oxygen flow of 5 l/m for 90 minutes. A top layer 332 of 2000 Å platinum was sputtered, a negative resist was applied followed by a standard photo mask process, an ion mill etch, an IPC strip and a final contact anneal at 750° C. in an oxygen flow of 5 l/m for 30 minutes. The sample was tested and had a dielectric constant is 114 at 1 megahertz, which is smaller than that of $BaBi_2Ta_2O_9$, but still 30 to 40 times the dielectric constant of conventional semiconductor dielectrics. The leakage current was higher, but still below $10^{-7}$ amps/$cm^2$ for fields below about 500 kv/cm, which is excellent within the range of voltages common in integrated circuits. This material is of particular interest because the presence of lead makes it extremely resistant to radiation damage. The elements from which the material is compounded are also relatively compatible with conventional integrated circuit materials.

EXAMPLE 6

Barium Bismuth Niobate—$BaBi_2Nb_2O_9$

The compounds shown in Table VI were measured.

TABLE VI

| Compound | FW | g | mmole | Equiv. |
|---|---|---|---|---|
| barium | 137.327 | 0.9419 | 6.8588 | 1.0000 |
| 2-ethylhexanoic acid | 144.21 | 2.0538 | | |
| bismuth 2-ethylhexanoate | (862.99) | 11.838 | 13.717 | 1.9999 |
| niobium butoxide | 458.48 | 6.2894 | 13.718 | 2.0001 |
| 2-ethylhexanoic acid | 144.21 | 10.051 | 69.697 | 10.162 |

The barium was placed in 30 ml of 2-methoxyethanol and 20 ml of toluene, to slow the reaction, and the first measure of 2-ethylhexanoic acid was added and allowed to react completely while stirring. Then the bismuth 2-ethylhexanoate was added followed by 50 ml xylenes. The mixture was stirred and heated with a maximum temperature of 118° C. to distill out all water, the toluene and the 2-methoxyethanol. The solution was allowed to cool to room temperature, then the niobium butoxide was added, followed by the second portion of the 2-ethylhexanoic acid and 30 ml additional xylenes. The mixture was heated to a temperature of 124° C. while stirring to distill out all butanol and water until 68 ml of solution remained. The concentration was 0.101 moles of $BaBi_2Nb_2O_9$ per liter. The wafer was baked at 140° C. in air for 30 minutes to dehydrate it. An eyedropper was used to place 1 ml of the $BaBi_2Nb_2O_9$ solution on a wafer as in FIG. 4 with the layers deposited up to and including the platinum bottom electrode 328. The wafer was spun at 1000 RPM for 20 seconds. The wafer was then placed on a hot plate and baked at 230° C. in air for two minutes. The wafer was placed in a rapid thermal processor and annealed for 30 seconds in an oxygen flow of 3 l/m at temperature of 700° C. with a 125° /sec ramp rate. The steps from using an eyedropper to place $BaBi_2Nb_2O_9$ solution on the wafer to the RTP were repeated for another layer. The wafer was then transferred to a diffusion furnace and annealed at 750° C. in an oxygen flow of 5 l/m for 1 hour. A top layer 332 of 2000 Å platinum was sputtered, a negative resist was applied, followed by a standard photo mask process, an ion mill etch, an IPC strip and a final contact anneal at 750° C. in an oxygen flow of 5 l/m for 30 minutes. The resulting sample was and had a dielectric constant was 103.46 at 1 megahertz. This is lower than the dielectric constants for $BaBi_2Ta_2O_9$ and $PbBi_2Ta_2O_9$, but still very high. The leakage current result again was not as excellent as for $BaBi_2Ta_2O_9$ and $PbBi_2Ta_2O_9$, but still below $10^{-6}$ amps per $cm^2$ for fields below about 300 kV/cm. Thus this material should be preferable to conventional integrated circuit dielectric materials. Again, this material should be relatively resistant to radiation damage as compared to conventional integrated circuit materials.

3. The Misted Depostion Process

According to a primary aspect of the present invention, precursor liquids of desired layered superlattice materials are initially prepared, and then mists of the solutions are generated, flowed into a deposition chamber and deposited in thin films/layers on substrates disposed within the deposition chamber.

The term "mist" as used herein is defined as fine drops of a liquid carried by a gas. The term "mist" includes an aerosol, which is generally defined a colloidal suspension of solid or liquid particles in a gas. The term mist also includes a vapor, a fog, as well as other nebulized suspensions of the precursor solution in a gas. Since the above terms have arisen from popular usage, the definitions are not precise, overlap, and may be used differently by different authors. Herein, the term aerosol is intended to include all the suspensions included in the text *Aerosol Science and Technology*, by Parker C. Reist, McGraw-Hill, Inc., New York, 1983. The term "mist" as used herein is intended to be broader than the term aerosol, and includes suspensions that may not be included under the term aerosol, vapor, or fog.

According to the second embodiment of the present invention, the mist of a precursor liquid is evenly flowed across and onto a substrate, preferably at ambient temperature. That is, preferably, the substrate is not heated. In this disclosure the term "ambient" means at the temperature of the surroundings, which preferably is room temperature, which is generally between 15° C. and 40° C. However, because various processes may be occurring during the deposition, such as drawing a vacuum, electrical poling, and/or the application of ultraviolet radiation, the actual temperature within deposition chamber 2 may vary from the temperature of the room in which the deposition takes place. Thus the use of the words "ambient temperature". Ambient temperature means generally within the range of −50° C. to 100° C. As will be discussed further below, a key aspect of the flow process is that the mist is flowed across the substrate via multiple input ports and exits the area above the substrate via multiple exhaust ports, with the ports being distributed in close proximity to and about the periphery of the substrate to create a substantially evenly distributed flow of mist across the substrate.

Another feature of the deposition process is that it is a relatively low energy process as compared to prior art deposition processes. It is believed that the deposition is caused by relatively low energy kinetic interactions between the liquid particles and also relatively low energy kinetic interactions between the particles and the barrier plate opposite the substrate. It has been found that heating the deposition chamber or substrate during deposition leads to inferior quality thin films.

Misted Deposition Apparatus

Figure 9:
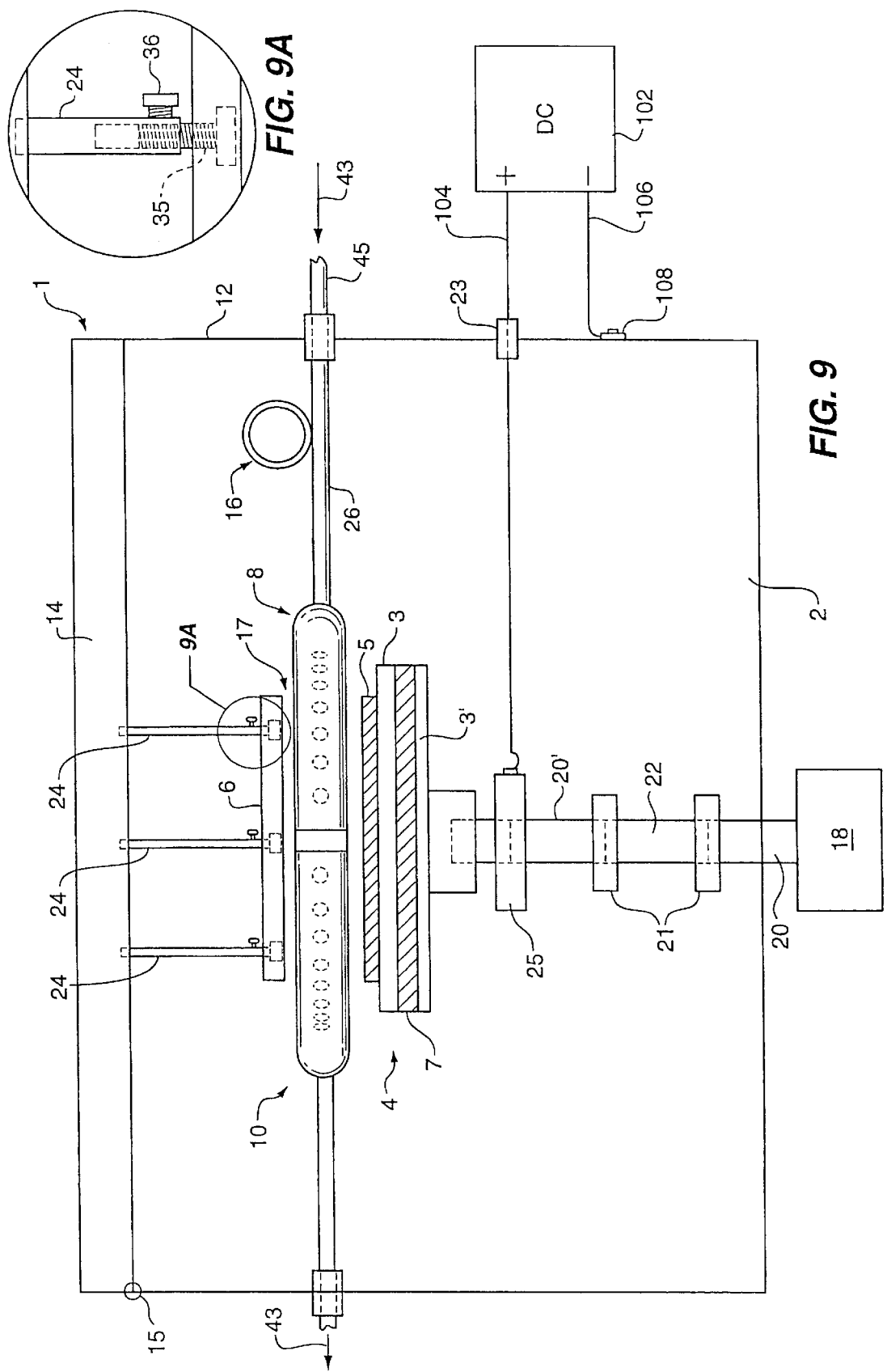
FIG. 9 is a cutaway side view of the deposition chamber of the apparatus according to one embodiment of the invention.

As shown in FIG. 9, there is a thin film deposition apparatus according to one exemplary embodiment of the invention, the apparatus being generally designated at 1. Apparatus 1 comprises a deposition chamber 2 containing a substrate holder 4, a barrier plate 6, an input nozzle assembly 8, an exhaust nozzle assembly 10, and an ultraviolet radiation source 16. The deposition chamber 2 includes a main body 12, a lid 14 which is securable over the main body 12 to define an enclosed space within the deposition chamber 2. The chamber is connected to a plurality of external vacuum sources described below. Lid 14 is pivotally connected to the main body 12 using a hinge as indicated at 15. In operation, a mist and inert carrier gas are fed in through tube 45, in direction 43, and pass through input nozzle assembly 8, where the mist is deposited onto substrate 5. Excess mist and carrier gas are drawn out of deposition chamber 2 via exhaust nozzle 10.

Substrate holder 4 is made from two circular plates 3, 3' of electrically conductive material, such as stainless steel, the top plate 3 being insulated from the bottom plate (field plate) 3' by an electrically insulative material, such as delrin. In an exemplary embodiment, utilizing a four-inch-diameter substrate, substrate holder 4 is nominally 6 inches in diameter and supported on a rotatable shaft 20 which is in turn connected to a motor 18 so that holder 4 and substrate 5 may be rotated during the deposition process. An insulating shaft 22 electrically insulates the substrate holder 4 and substrate 5 supported thereon from the DC voltage applied to the deposition chamber main body 12 so that a DC bias can be created between the substrate holder 4 and barrier plate 6 (via chamber main body 12). Such a DC bias may be utilized, for example, for field-poling of thin films as they are being deposited on the substrate 5. Insulating shaft 22 is connected to shaft 20 and shaft 20' by couplings 21. Electrical source 102 is operatively connected to main body 12 of deposition chamber 2 at connection 108 by lead 106, and via feedthrough 23 to brass sleeve 25 by lead 104, to effect a DC bias between field plate 3' and barrier plate 6.

Barrier plate 6 is made of an electrically conductive material such as stainless steel, and is of sufficiently large size to extend substantially over the substrate 5 in parallel thereto so that a vaporized source or mist as injected through input tube 26 and nozzle assembly 8 is forced to flow between barrier plate 6 and the substrate holder 4 over the substrate 5. Barrier plate 6 is preferably the same diameter as the substrate holder 4. As depicted in FIG. 1, the barrier plate 6 is preferably connected to the lid 14 by a plurality of rods 24 so that the plate 6 will be moved away from the substrate 5 whenever the lid is opened. The barrier plate 6 also includes a UV transmitting window 27 which is about 0.75 inches wide by four inches long. The window 27 permits the UV radiation from source 16 to directly fall on substrate 5. The window 27 is preferably made of quartz, but also may be made of suprasil or other suitable material.

FIGS. 18 and 19 show barrier plate 6 located at various distances from substrate holder 4. Each of the rods 24 is typically a stainless steel rod attached to deposition chamber lid 14. Each rod 24 is bored to accommodate a bolt 35 (FIG. 9A) by which the rod 24 is attached to barrier plate 6. Each rod 24 is tapped to accommodate a set screw 36 which secures bolt 35 to the rod 24. By loosening set screw 36, re-positioning rod 24 relative to bolt 35, and then re-tightening set screw 36, the effective length of each rod is adjustable up to ½ inch without having to remove the rod 24 from the chamber lid 14. Each of the rods 24 is removable to allow sets of rods 24 of different lengths L, L', etc. to be substituted to coarsely adjust the corresponding spacing S, S', etc. between barrier plate 6 and substrate holder 4 (and substrate 5) depending on the source materials, flow rate, etc. For example, the rod length L may be adjusted to provide a spacing S in the range of 0.10–2.00 inches. Once in place, rods 24 are also adjustable as indicated above. Thus, rods 24, bolts 35, and set screws 36 comprise an adjusting means for adjusting the barrier plate 6. Adjustment of the height of substrate holder 4 is also possible by changing the length of shaft 20' (FIG. 1). The spacing between substrate holder 4 and barrier plate 6 is preferably approximately between 0.250 inches and 0.5 inches when a precursor liquid of strontium bismuth tantalate, as prepared below, is to be deposited. Most preferably it is between 0.35 inches and 0.37 inches.

Figure 15:
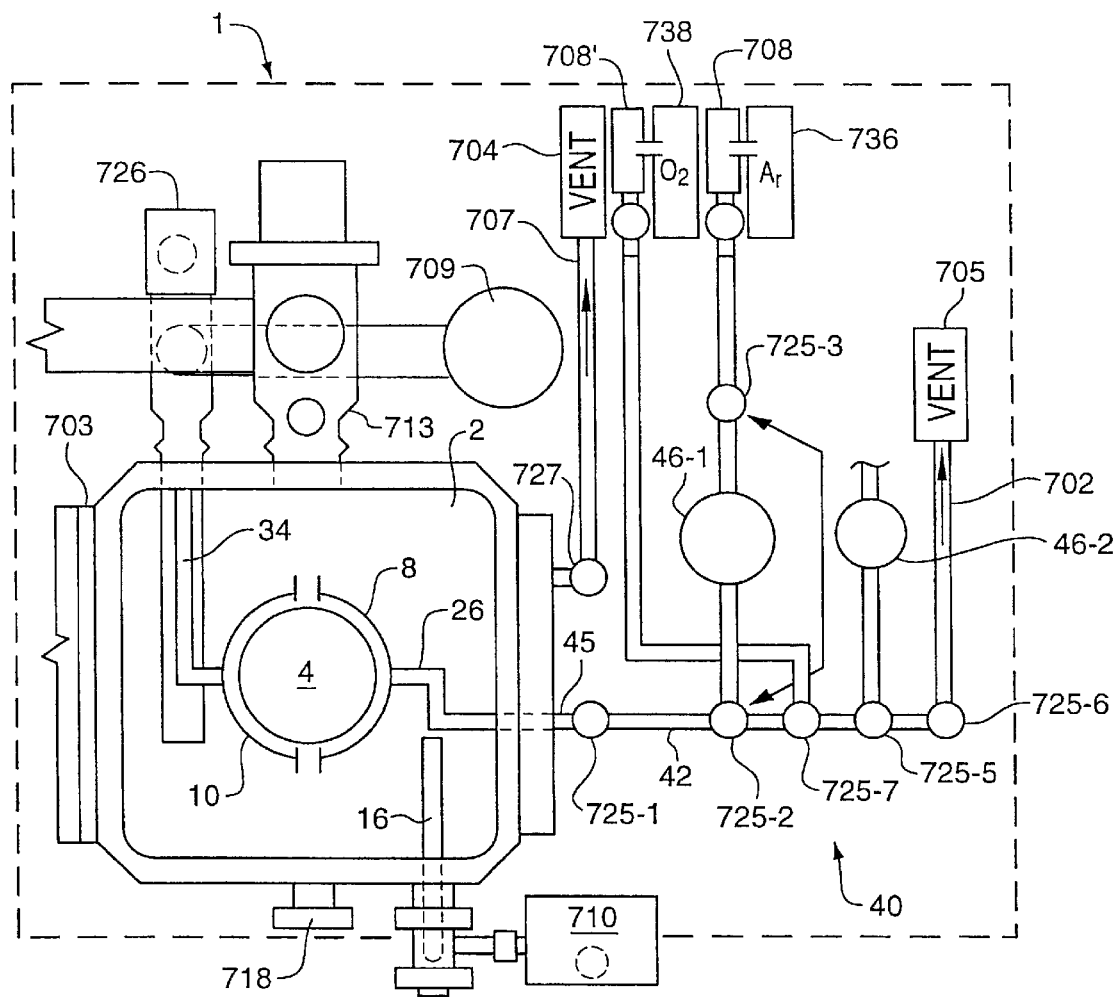
FIG. 15 is a top view of the apparatus of the exemplary embodiment of the invention of FIG. 9.
Figure 16:
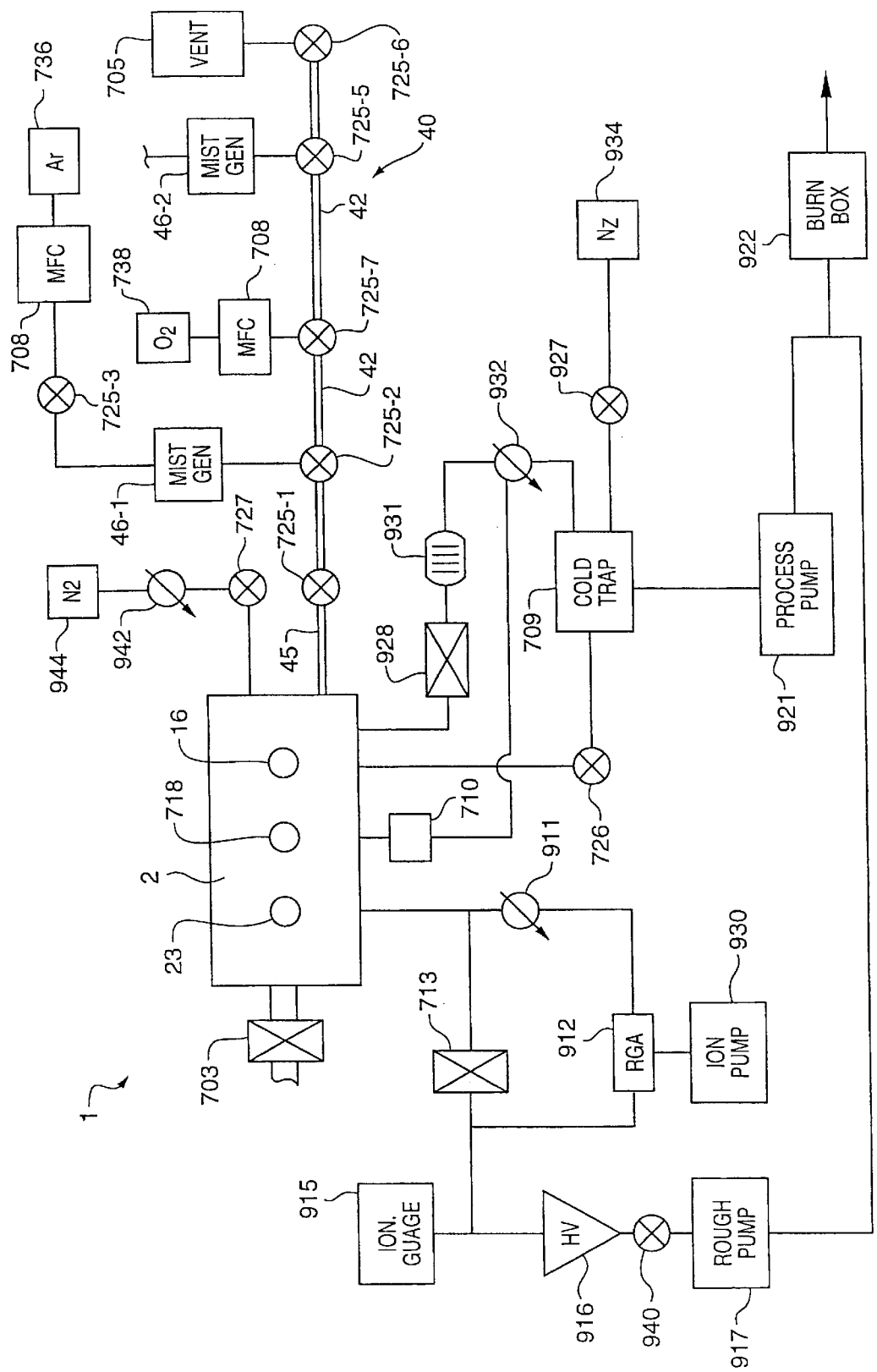
FIG. 16 is a schematic view of the apparatus corresponding to the embodiment of FIG. 15.

FIG. 15 is a top view of the apparatus of an exemplary embodiment of the invention, and FIG. 16 is a schematic view of the apparatus corresponding to the embodiment of FIG. 15. A 0–1000 Torr temperature compensated capacitance manometer 710 (FIG. 15) monitors the pressure in deposition chamber 2, and its signal controls a downstream control valve 932 (FIG. 16) to maintain precise pressures in deposition chamber 2. Deposition chamber 2 is rough-pumped by vacuum pump 921, which in one embodiment is an Alcatel 2-stage, 11 CFM mechanical fore pump. After being rough-pumped, deposition chamber 2 is high vacuum pumped through a vacuum pump 916 such as a C.T.I. Cryo-Torr 100 high vacuum pump. Other turbomolecular or cryogenic pumps could also be used for high vacuum pumping. High vacuum pump-down of deposition chamber 2 to below $5.0 \times 10^{-6}$ Torr is accomplished with valve 713 opened, using high vacuum pump 916, with valve 940 closed. High vacuum pump 916 is backed by pump 917 which is used as needed (typically every two weeks) for regeneration of pump 916, with valve 940 opened for this operation only. Ionization gauge 915 is used to monitor the vacuum in chamber 2. High vacuum pump-down of deposition chamber 2 is used to facilitate adsorption of moisture from the chamber walls as well as from a substrate 5 located inside of the chamber, prior to a deposition operation.

An RGA (residual gas analyzer) 912 (FIG. 16) may be provided for analyzing the decomposition products within deposition chamber 2 from one atmosphere to extremely low pressures. Mass resolution of up to 300 AMU is provided. In an exemplary embodiment, RGA 912 is a U.T.I. residual gas analyzer, connected to a Varian Associates 10 LPS ion pump 930. Valves 727 and 942 are used to vent nitrogen from source 944 into the deposition chamber 2 for the purpose of back filling the chamber 2. Valve 942 is a needle valve which is used to precisely regulate the flow of nitrogen into the chamber 2.

Deposition chamber 2 is vacuum pumped to a pressure of between approximately 200 and 600 Torr during a deposition operation by means of process pump 921. The deposition chamber exhaust system includes, in addition to pump 921, a liquid nitrogen cold trap 709, and an MKS control valve 932 with controller and manual valve. Cold trap 709 may be purged with dry nitrogen from source 934. A Dayton solenoid valve 927 is used to back fill the roughing line with the dry nitrogen gas. Cold trap 709 is connected to process chamber 2 via valve 726, and also via needle valve 932, filter 931, and process line valve 928. The deposition chamber effluents are directed to a burn box and scrubber combination 922 to assure safe disposal of any toxic corrosive and flammable vapors.

Access to an external chamber (not shown) from deposition chamber 2 is provided through an air-operated slit valve 703 (FIG. 15). The interior of deposition chamber 2 can be viewed during a deposition operation through view port 718.

Mass flow controller 708 and VCR valve 725-3 control the dispersion rates of source materials, i.e. precursor liquids, through manifold assembly 40 (FIG. 11) into deposition chamber 2 by regulating the flow of an inert gas such as argon from source 736 into mist generator 46-1. Additional gas source, mass flow controller, and valve inputs (not shown) can be connected to mist generator 46-2, which connects to manifold assembly 40 via VCR valve 725-5. A separate mass flow controller 708' is used to introduce oxygen from source 738 and/or other inert or process-active gases into manifold assembly 40 via VCR valve 725-7.

Figure 10:
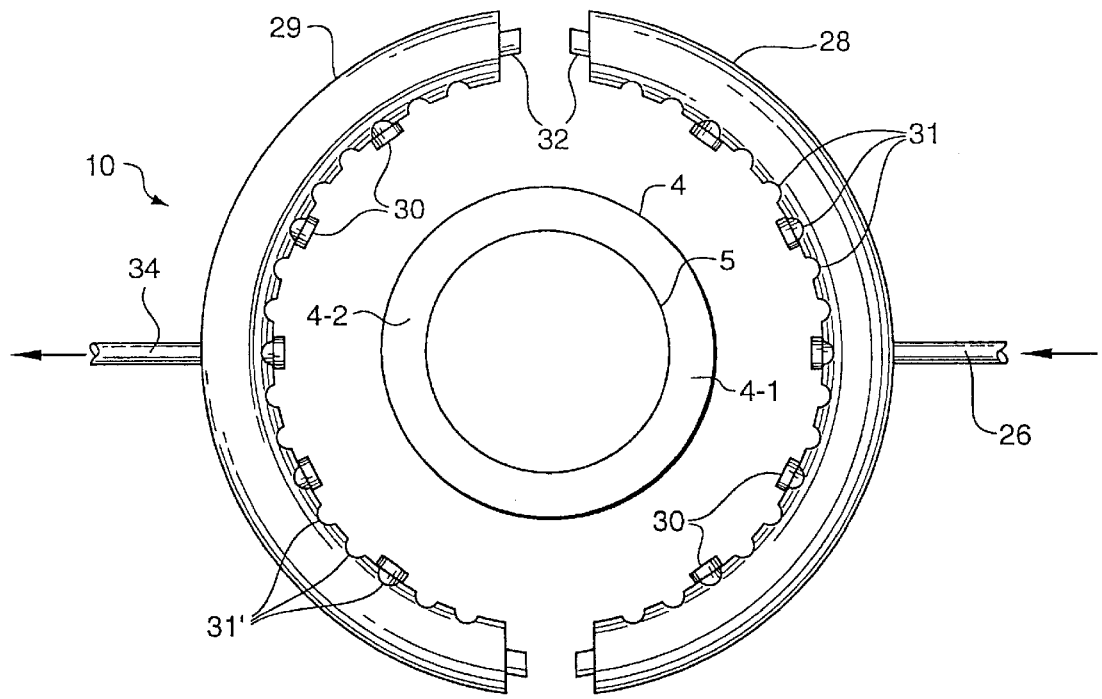
FIG. 10 is an enlarged plan view of an intake and exhaust nozzle assembly.

The input nozzle assembly 8 and the exhaust nozzle assembly 10 are more particularly shown with reference to FIG. 10. Input nozzle assembly 8 includes an input tube 26 which receives a misted solution from manifold assembly 40 as discussed below in relation to FIG. 11. Input tube 26 is connected to arcuate tube 28 which has a plurality of small holes or input ports 31 for accepting removable screws 30, the ports 31 spaced ¼ inch center-to-center along the inner circumference of the tube 28.

Exhaust nozzle assembly 10 comprises an arcuate exhaust tube 29 having a plurality of small holes or exhaust ports 31' with removable screws 30. The structure of the exhaust nozzle assembly 10 is substantially the same as that of the input nozzle assembly 8, except that a tube 34 leads to a vacuum/exhaust source (not shown in FIG. 10). End caps 32 of tubes 28 and 29 are removable for cleaning. Arcuate tube 28 of input nozzle assembly 8 and the corresponding arcuate tube 29 of exhaust nozzle assembly 10 respectively surround oppositely disposed peripheral portions 4-1, 4-2 of substrate holder 4.

In an exemplary embodiment wherein a BST film is to be deposited, the centers of holes 31, 31' in tubes 28 and 29 are nominally located 0.375 inches above substrate holder 4. However, as mentioned above, this distance is adjustable by adjusting the length of shaft 20' to suit the specific deposition process.

Each of the tubes 28, 29, is typically fabricated from ¼" O.D. stainless steel, with an inner diameter of approximately ³⁄₁₆. The interior walls of each tube 28, 29 are preferably electro-polished. Holes 31, 31' in tubes 28 and 29 respectively are spaced approximately ¼" center-to-center, and are tapped to accommodate 4-40 (⅛") socket head set screws.

Through such structure, and by adjusting the location of open holes 31, 31' by selectively inserting or removing screws 30 in the two arcuate tubes 28 and 29, the flow of a vaporized solution or mist over the substrate 5 can be well controlled for various solutions and flow rates, etc., to achieve a uniform deposition of a thin film on substrate 5.

Referring to FIGS. 1 and 2, substrate holder 4, barrier plate 6, input nozzle assembly 8 and exhaust nozzle assembly 10 collectively cooperate to define a relatively small, semi-enclosed deposition area 17 surrounding an upper/exposed surface of the substrate 5, and within which the vaporized solution is substantially contained throughout the deposition process.

Although exemplary embodiments of substrate holder 4, barrier plate 6, input nozzle assembly 8 and exhaust nozzle assembly 10 are shown and described, it is understood that variations of such structures can be utilized within the scope of the present invention. For example, the arcuate input and exhaust tubes 28 and 29 could be replaced with tubes of other structures such as V-shaped or U-shaped tubes, or slotted tubes, or could simply be replaced by a plurality of separate nozzles and separate exhaust ports.

Figure 11:
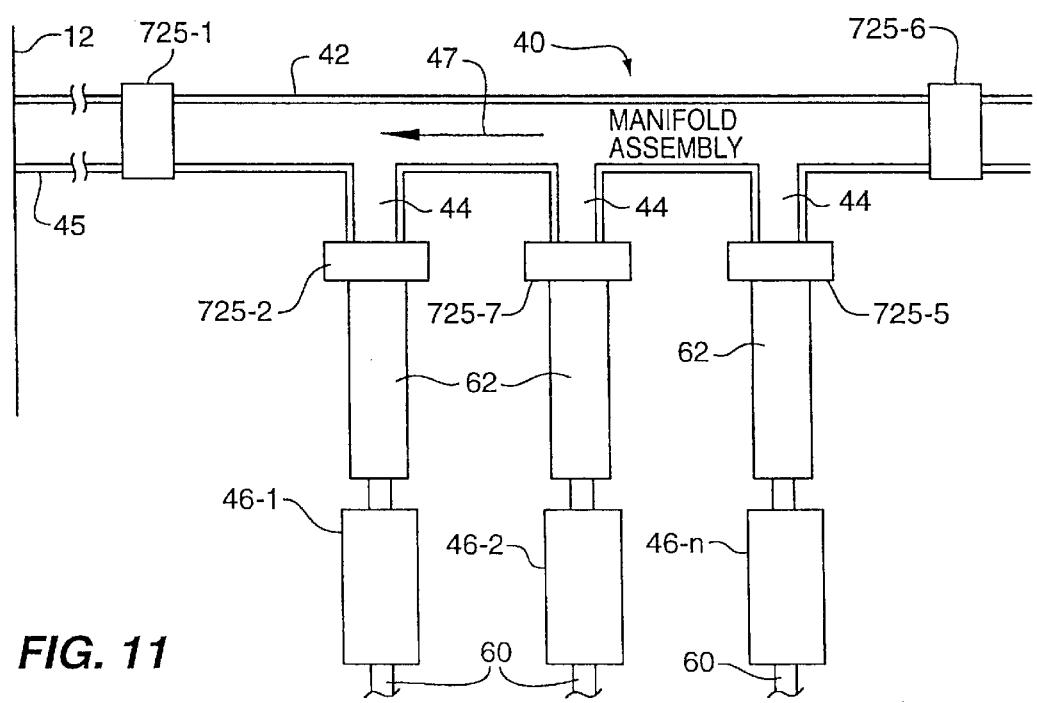
FIG. 11 is an enlarged schematic top view of a manifold system used in the invention.

FIG. 11 shows a manifold assembly 40 according to the present invention. The manifold assembly 40 is utilized for supplying a vaporized solution (mist or aerosol) to input nozzle assembly 8, and generally comprises a mixing chamber 42, a plurality of inlets 44 which are connected to corresponding mist generators through respective valves 725-2, 725-5, 725-7, a deposit valve 725-1 for regulating flow from the mixing chamber 42 to the nozzle assembly 8, and an exhaust vent valve 725-6.

In use, one or more of the mist generators 46-* are utilized to generate one or more different mists which are then flowed into the mixing chamber 42 through valves 725-* and inlets 44.

The mists as flowed into the mixing chamber 42 are mixed to form a single, uniform misted solution which is then flowed into the deposition chamber 2 at an appropriate flow rate through the valve 725-1 and input tube 26. Valve 725-1 can be selectively closed off so that the deposition chamber 2 can be pumped down if desired, or to clean and purge the manifold system when necessary. Similarly, the outlet of the exhaust valve 725-6 is connected to a vacuum source (not shown) so that, when necessary to exhaust/purge one or more of the mist generators 46, valve 725-1 can be closed off, valve 725-6 and one or more of the valves 725-* can be opened, and the mixing chamber 42 can be pumped down to clean and purge the mist generator(s) 46 and the mixing chamber 42 by applying a vacuum via pump 921 and/or pump 916, or using standard negative draw type exhaust.

Figure 12:
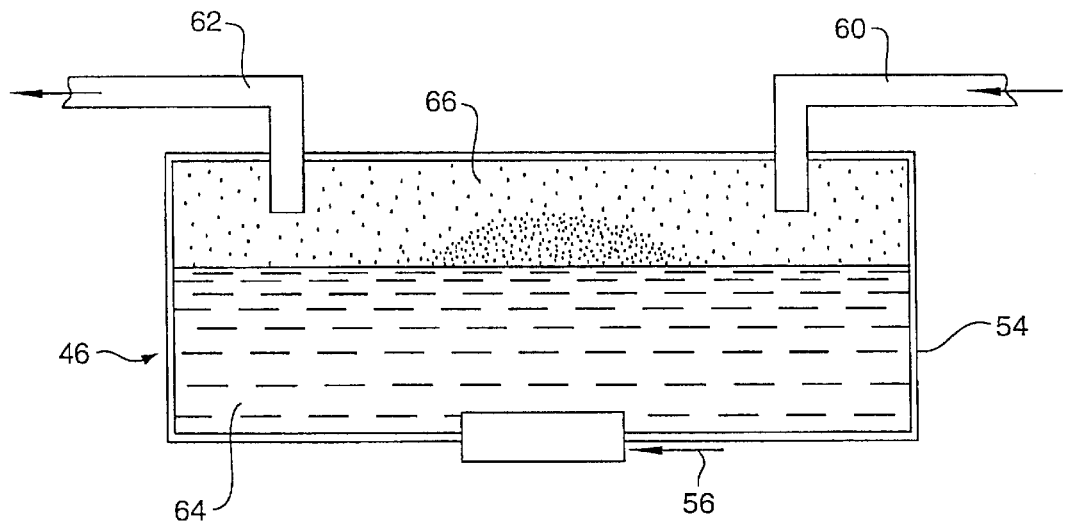
FIG. 12 is a schematic side view of a mist generating apparatus used in the present invention.
Figure 13:
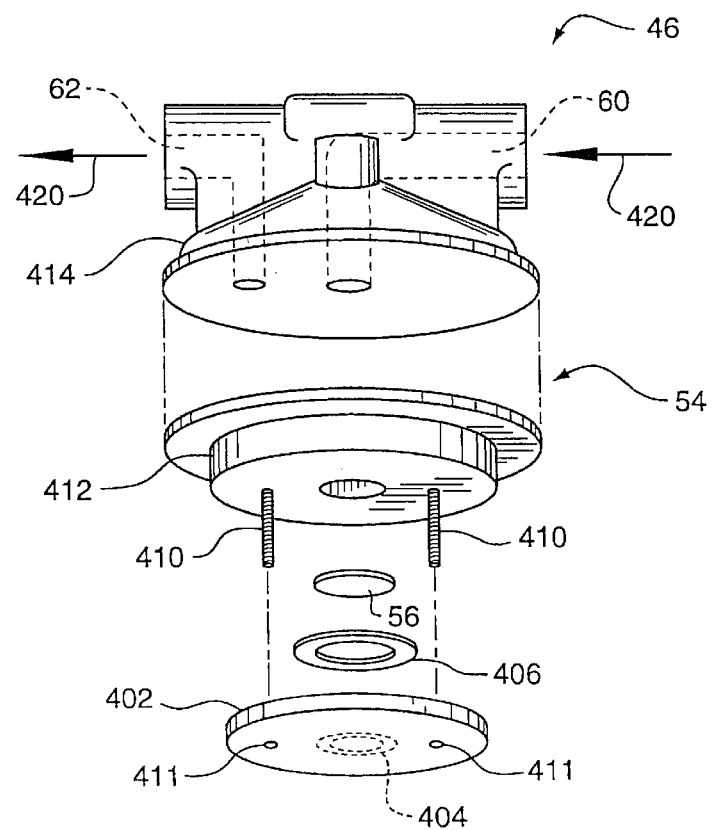
FIG. 13 is an exploded view of the mist generating apparatus of FIG. 12.

The stabilized precursor solutions are agitated ultrasonically to atomize or nebulize the solutions before they are introduced into the deposition chamber 2 to produces a mist of the stabilized precursor solution(s). FIG. 12 illustrates a schematic side view of an exemplary embodiment of the mist generating apparatus used in the present invention. FIG. 13 is an exploded view of the bottom section 412 and the top section 414 of mist generating apparatus of FIG. 12. As shown in FIGS. 12 and 13, mist generator 46 includes a closed container 54, and a TDK TU-26B or equivalent ultrasonic transducer 56 fluid-tightly and vacuum sealed into the bottom of the container 54. Container 54 is a modified Millipore Waferguard T-Line gas filter unit (catalog no. YY50 005 00) without the internal filter cartridge. The direction of gas flow as indicated by arrows 420 is opposite to that which would be used in normal operation of the filter. Transducer 56 is mounted in a recessed hole in bottom section 412 of mist generator 46 and is affixed to section 412 by two 8-32 threaded studs 410 which pass through holes 411 in a delrin mounting block 402. A teflon "O" ring 404 and teflon seal 406 provide a pressure- and vacuum-tight seal between the transducer 56 and the inside of container 54. Mist generator 46 also includes an inlet port 60 and an outlet port 62 for passing a carrier gas through the container 54. Before operation, a predetermined amount of precursor liquid 64 is introduced into container 54 after separating bottom section 412 from top section 414 of container 54. During operation, transducer 56 is electrically activated to generate a mist 66 of the precursor liquid, and an inert carrier gas is passed into the mist 66 via port 60 where it becomes wet or saturated with the mist, and the wet carrier gas is then passed from the outlet port 62 into the manifold assembly 40. The carrier gas is normally an inert gas such as argon, helium, or nitrogen, but may comprise a reactive gas in appropriate situations. The mist generator 46 shown in FIGS. 4 and 5 is particularly advantageous because it creates a vaporized solution which can be effectively flowed or injected into the deposition chamber 2 without complications such as freezing.

FIG. 17 is a perspective view showing the placement of an ultraviolet radiation source 16 within the deposition chamber 2. Photo-enhancement of the present process is effected by providing UV (ultraviolet) light during and after the deposition process which is believed to stimulate the disassociation of solvent and organics from the precursor, thereby accelerating the drying process. In addition, the use of UV radiation prior to the deposition process facilitates the removal (desorption) of moisture from deposition chamber 2 as well as from substrate 5. The location of ultraviolet light source 16 within the deposition chamber is not critical because of the fact that the ultraviolet radiation is reflected off of the stainless steel walls of deposition chamber 2 into the space between the input nozzle 8 and exhaust nozzle 10, as well as onto substrate 5, where the radiation can provide the above-described photo-enhancement effect.

UV source 16 includes at least one UV lamp located in deposition chamber 2, for applying an ultraviolet radiation bath therein. Spectral sources which could be used include ultraviolet lamps and excimer lasers. In either case, the radiation bath applied by UV source 16 is tuned to optimize the dissociation of the desired chemical compound from the solvent and the organics or other fragments. In the first case, radiation emitted by an excimer laser is spectrally "tuned" to correspond to the energy needed to dissociate or crack the solvent bonds, the precursor chemical compound bonds and/or any intermediate organic complex bonds formed during the deposition process holding the desired compound in a given precursor liquid. Alternatively, if UV source 16 is a UV lamp (or plurality of lamps), then "tuning" is accomplished by exchanging one (or a set of) the UV lamps with another one of (or set of) UV lamps which have a more desirable frequency spectrum. The UV source should also be of relatively low power, since otherwise it could dry out the precursor mist.

If a ferroelectric thin film is being deposited from a vaporized carboxylate precursor, as for example those used for the layered superlattice material precursors described below, it is preferable to use a Danielson Phototron PSM-275 UV radiation source 16 which emits UV radiation rays having a wavelength of approximately 180–260 nanometers.

Apparatus 1 shown in FIGS. 1, 7, and 9 includes electrical means 102 for applying a DC bias in the deposition chamber 2 during a deposition operation. FIG. 9 shows the DC input 104. The DC potential applied between input sleeve 25 and deposition chamber main body 12 is typically 350 volts. The DC bias achieves poling in-situ of the ferroelectric film adding to the film quality. Dipole ordering along the crystal c-axis (the major polarization axis) is often desirable, and the resulting ordering reduces dislocation density which can be responsible for fatigue and retention problems.

A DC bias of either greater than or less than 350 volts could also be used to effectuate the above results. In addition, while deposition is occurring, combinations of ultraviolet radiation and DC bias may be applied within chamber 2 either together or sequentially, and repeated.

A supplemental heating means, such as a hot plate, (not shown) may be used to bake and/or anneal a film of a precursor liquid which has previously been deposited on a substrate, the baking and annealing being preferably conducted in an auxiliary chamber, although the baking/ annealing process could be performed within the deposition chamber 12, as discussed in relation to steps P22 and P23 of FIG. 14. The annealing is preferably performed in an oxygen furnace. High energy density ultraviolet radiation, such as from a diffused excimer laser source is also a preferred method of annealing.

The Misted Depostion Process

Referring to FIG. 14, there is shown an exemplary flow chart depicting in detail the misted depostion process of the invention. The steps P1 through P5 have been described above.

Just before coating, in step P13, an initiator may be added to the precursor. An initiator is a high vapor pressure, low boiling point, solvent that assists in initiating the formation of the mist. Preferably, the metal moieties in the precursor are also soluble in the initiator, that is, the initiator is a solvent for the metal moieties. A liquid with a boiling point of between about 50° C. and 100° C. is preferred as an initiator. Examples of liquids that may be used as initiators are given in Table B.

TABLE B

| Initiator | Boiling Point |
| --- | --- |
| Methyl Ethyl Ketone | 80° C. |
| Isopropanol | 82° C. |
| Methanol | 64.7° C. |
| Tetrahydrofuran | 67° C. |

EXAMPLE 7

An example of the process of steps P1 through P5 for making a strontium bismuth tantalate precursor used is as follows. This process is a little different then the process given in Example 1 above; the process up to and not including the addition of the initiator is currently considered to be the preferred process for preparation of a strontium bismuth tantalate precursor for either spin deposition or misted deposition, since it is a little simpler, though the process of Example 1 is still very useful. The compounds shown in Table C were measured. As before, in Tables C and D below, "FW" indicates formula weight, "g" indicates grams, "mmoles"

TABLE 7

| Compound | FW | g | mmole | Equiv. |
| --- | --- | --- | --- | --- |
| Tantalum butoxide | 546.52 | 52.477 | 96.020 | 2.0000 |
| 2-ethylhexanoic acid | 144.21 | 87.226 | 604.85 | 12.598 |
| Strontium | 87.63 | 4.2108 | 48.052 | 1.0009 |
| Bismuth 2-ethylhexanoate | (790.10) | 82.702 | 104.67 | 2.1802 | indicates millimoles, and "Equiv." indicates the equivalent number of moles in solution. The tantalum butoxide and 2-ethylhexanoic acid were placed in a flask and about 50 milliliters (ml) of xylenes was added. The mixture was stirred on low heat of between about 70° C. and 90° C. for 48 hours. The strontium was added and the solution was again stirred on low heat until completely reacted. The temperature was then raised to a maximum of 120° C. while stirring to distil out the butanol, until there remained about 40 ml of distillate. Then the bismuth 2-ethylhexanoate was added and diluted to 240 ml with xylenes. The concentration was 0.200 moles of $SrBi_2Ta_2O_9$ per liter. This precursor was stored until ready for use.

Just prior to deposition, in step P13, 4 ml of a strontium bismuth tantalate precursor as described above was placed in container 54 of mist generator 46 along with 10 ml of methyl ethyl ketone (MEK) initiator. In step P12 a substrate 5 comprising a silicon wafer 322 with layers of silicon dioxide 324 and platinum deposited on it was placed in the deposition chamber 12 on the substrate holder 4. The deposition chamber 12 was pumped down to $10^{-6}$ Torr using rough pump 921 via valve 726 and high vacuum pump 916 via valve 713. Substrate rotation motor 18 was turned on to rotate substrate holder 4 at 60 cycles a minute. UV source 16 was then turned on for 30 minutes to desorb the moisture in the deposition chamber as well as any moisture on the substrate. High vacuum valve 713 was then closed off, and the deposition chamber was slowly back filled via valves 727 and 942 an inert nitrogen gas from source 944 to a pressure of approximately 595 Torr. Next, the process vacuum line was opened by opening exhaust throttle valve 928, filter 931, and needle valve 932 to stabilize the deposition chamber pressure at approximately 595 Torr. Injection valve 725-1 and deposit valve 725-2 were then opened and valve 725-6 was closed to start the flow of argon from source 736 through ultrasonic mist generator 46 which was then turned on for 5 minutes to coat substrate 5 in step P20. The UV source was left on through this process, i.e. the optional UV treatment steps P16 and P17 were used with this example. The wafer 300 was removed from the deposition chamber 12 and placed on a hot plate where it was dried in step P22 at a temperature of 150° C. for 2 minutes, then baked in step P23 at a temperature of 400° C. for 5 minutes. The wafer 300 was then transferred to a rapid thermal processing oven where RTP was performed instep P24 at 750° C. for 30 seconds. Then the wafer 300 was returned to the deposition chamber 12, the mist was formed again and steps P20 through P24 were repeated with UV being applied to the mist in step P16 and the wafer 300 in step P17. The RTP process P24 for the second layer was at 725° C. for 30 seconds in oxygen. The wafer 300 was then annealed in oxygen for one hour. The resulting film 330 was approximately 2100 Angstroms (Å) thick.

At the end of each of the two coating steps P20, the mist generator 46-1, UV source 16, and substrate rotation motor 18 were turned off, deposit valve 725-1 was closed, valve 725-6 was then opened and transducer 56 was turned off, to vent manifold 40 through vent 705 until mist generator 46-1 reached ambient temperature. While the wafer 300 remained in the deposition chamber, the chamber was slowly pumped down to 0.4 Torr for ½ hour using pump 921. During the slow-pumping, valve 928, filter 931, and valve 932 remained open until the chamber pressure reached 0.4 Torr. Thereafter, valve 928 was closed and valve 713 was opened to allow high-vacuum pump 916 to pump the deposition chamber 2 down to $10^{-6}$ torr for 10 minutes. Next, valve 713 was closed and the deposition chamber was vented to atmospheric pressure by opening vent valve 727. At the end of the entire deposition process, manifold 42 was purged through vent 705 by applying argon gas from source 736.

After the anneal step P30, the IC device 300 was completed in step P40, i.e. second platinum electrode 332 was sputtered on and the wafer was then etched using well-known photo-resist techniques to produce a plurality of capacitors 317A, 317B, etc. electrically connected via bottom electrode 328.

Figure 20:
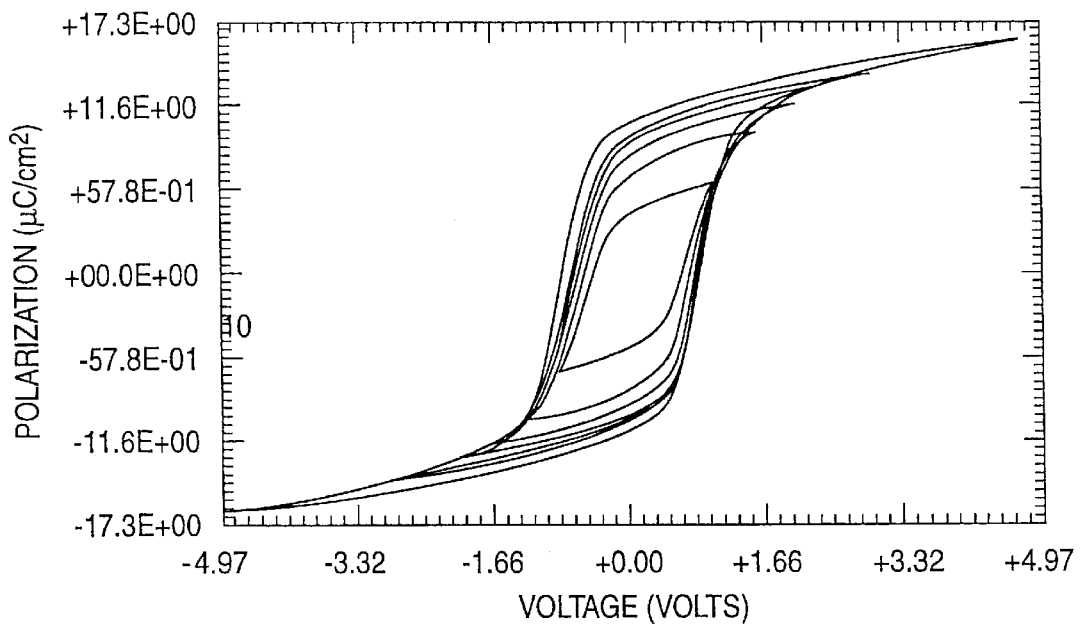
FIG. 20 is a graph of the measured hysteresis curves for six voltages between 1 volts and 5 volts for a thin film strontium bismuth tantalate capacitor utilizing a platinum bottom electrode and made by the process of the invention.

Hysteresis measurements were made on the strontium bismuth tantalate capacitor fabricated by the above process using and uncompensated Sawyer-Tower circuit at 10,000 Hertz and at voltages of 1 volt, 1.5 volts, 2 volts, 2.5 volts, 3 volts, and 5 volts. The results are shown in FIG. 20. The ordinate is the polarization in microcoulombs per square centimeter while the abscissa is the applied voltage in volts. The hysteresis curves are tall and boxy, indicating the capacitors would perform well in a memory. The polarizability, 2Pr, is 20.9 microcoulombs/cm$^2$ for the 5 volt measurement. The coercive voltage, 2Vc, was 1.66 volts. The measured leakage current for the same sample was about $7 \times 10^{-8}$ amps per square centimeter at 5 volts and significantly lower at lower voltages, which are again excellent results showing the material would perform excellently in a memory.

Figure 21:
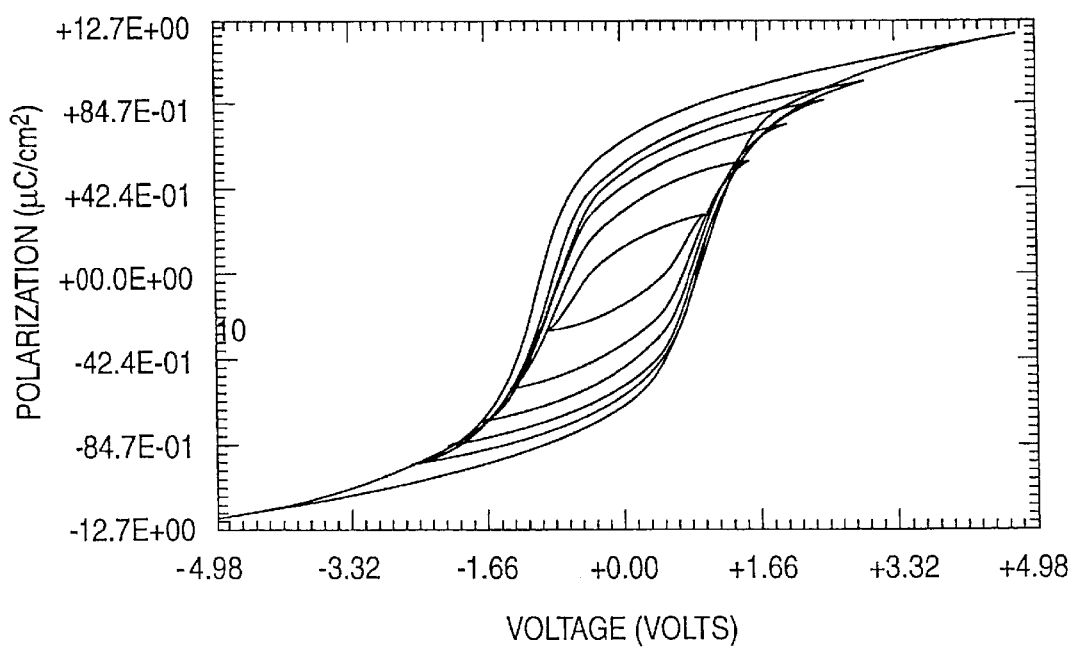
FIG. 21 is a graph of the measured hysteresis curves for six voltages between 1 volts and 5 volts for a thin film strontium bismuth tantalate capacitor utilizing a platinum/titanium bottom electrode and made by the process of the invention.

Another sample was prepared as in Example 7 above except that the substrate 5 included a 200 Å thick layer 326 of titanium. The hysteresis curves measured as indicated above are shown in FIG. 21. The shape of the curves is less boxy, though still boxy enough to indicate that the samples would work well in a memory. The polarizability for the 5 volt curve is 12.9 microcoulombs/cm$^2$. The coercive voltage, 2Vc, was measured as 2.16 volts. The measured leakage current at 5 volts was $5 \times 10^{-8}$.

The yield was found to be much better for the platinum/titanium electrodes. About half the devices shorted for the platinum only bottom electrodes, while none of the devices shorted for the platinum/titanium bottom electrodes.

Further examples of strontium bismuth tantalate capacitors were made as indicated in the misted deposition examples above, except that the substrates 5 were preannealed at 800° C. for 30 minute is oxygen for the platinum bottom electrode samples and at 650° C. for 30 minutes in oxygen for the Ti/Pt samples. For the platinum-only bottom electrode samples, the yield dropped to only about 10% but the 2Pr value rose to 21.6 microcoulombs/cm$^2$. For the Ti/Pt bottom electrodes, the yield stayed at 100%, but the polarizability dropped to 11.8 microcoulombs/cm$^2$.

EXAMPLE 8

Samples of strontium bismuth tantalum niobate capacitors were made as described in Example 7, with Ti/Pt bottom electrodes, except that an a strontium bismuth niobate precursor, made in the same way as the strontium bismuth tantalate precursor of Example 7 but with niobium isopropxide replacing the tantalum butoxide, was added to the strontium bismth titanate precursor. An amount of the strontium bismuth niobate precursor was added to yield an approximately 50/50 ratio of tantalum to niobium in the precursor. The thickness of the resulting ferroelectric layer 330 ranged from 1900 Å to 2300 Å the polarizabilities ranged from 11.7 microcoulombs/cm$^2$ to 12.5 microcoulombs/cm$^2$ at 5 volts, the coercive fields, 2Ec, from 124 volts/cm to 136 kilovolts/cm, and the leakage currents from $5 \times 10^{-6}$ amps/cm$^2$ to $1 \times 10^{-5}$ amps/cm$^2$ at 5 volts.

EXAMPLE 9

The compounds shown in Table 9 were measured. The tantalum butoxide,

TABLE 9

| Compound | FW | g | mmole | Equiv. |
|---|---|---|---|---|
| Tantalum butoxide | 546.52 | 52.4650 | 96.020 | 2.0000 |
| 2-ethylhexanoic acid | 144.21 | 87.222 | 604.83 | 12.600 |
| Niobium isopropoxide | 388.35 | 11.184 | 28.799 | 0.6000 |
| Strontium | 87.63 | 5.0490 | 57.617 | 1.2003 |
| 2-ethylhexanoic acid | 144.21 | 24.710 | 171.35 | 3.5698 |
| Bismuth 2-ethylhexanoate | (753.08) | 105.44 | 140.01 | 2.7802 | niobium isoporpoxide, were place in a flask with the first measure of 2-ethylhexanoic acid and about 50 milliliters (ml) of xylenes. The mixture was stirred on low heat of between about 70° C. and 90° C. for 48 hours. The second measure of 2-ethylhexanoic acid was added followed by the strontium. The solution was again stirred on low heat until completely reacted. The temperature was then raised to a maximum of 120° C. while stirring to distil out the butanol, until there remained about 40 ml of distillate. Then the bismuth 2-ethylhexanoate was added and diluted to 260 ml with xylenes. The concentration was 0.200 moles of $Sr_{1.2}Bi_{2.78}TaNb_{0.4}O_9$ per liter. This precursor was stored until ready for use.

Just prior to deposition 4 ml of a strontium bismuth tantalum niobate precursor as described above was placed in container 54 of mist generator 46 along with 10 ml of methyl ethyl ketone (MEK) initiator.

Using this precursor, samples of capacitors were made as described in Example 7, with titanium/platinum bottom electrodes. One sample had a film 330 thickness of 2150 Å a polarizability, 2Pr, of 12.7 microcoulombs/cm$^2$ at 5 volts, a coercive field, 2Ec, of 166 kilovolts/cm, and a leakage current of $5 \times 10^{-5}$ amps/cm$^2$ at 5 volts. Another sample had a film 330 thickness of 2050 Å a polarizability, 2Pr, of 14.7 microcoulombs/cm$^2$ at 5 volts, a coercive field, 2Ec, of 166 kilovolts/cm, and a leakage current of $4 \times 10^{-7}$ amps/cm$^2$ at 5 volts.

EXAMPLE 10

Several more samples were made as in Example 9, except that the final solvent added just prior to placing the precursor in the mist generator 46-1 was n-butyl acetate instead of methyl ethyl ketone. In some instances the addition butyl acetate as a co-solvent with xylenes yields better quality devices, though the reasons are not yet fully understood. It is believed that n-butyl acetate generally wets the subtrate better than xylenes and provides better step coverage. Both samples had film 330 thicknesses of 1850 Å while one had a polarizability, 2Pr, of 14.1 microcoulombs/cm$^2$ at 5 volts, a coercive field, 2Ec, of 182 kilovolts/cm, and a leakage current of $1 \times 10^{-7}$ amps/cm$^2$ at 5 volts, while the other had a polarizability, 2Pr, of 12.9 microcoulombs/cm$^2$ at 5 volts, a coercive field, 2Ec, of 199 kilovolts/cm, and a leakage current of $3 \times 10^{-7}$ amps/cm$^2$ at 5 volts.

Although there has been described what is at present considered to be the preferred embodiments of the present invention, it will be understood that the invention can be embodied in other specific forms without departing from the spirit or essential characteristics thereof. The present embodiments are, therefore, to be considered in all aspects as illustrative and not restrictive. The scope of the invention is indicated by the appended claims rather than the foregoing description.

We claim:

1. A method of fabricating a ferroelectric layered superlattice material comprising the steps of:
   providing a substrate;
   providing a liquid precursor including a plurality of metal moieties in effective amounts for forming a ferroelectric layered superlattice material;
   applying said precursor liquid to said substrate; and
   treating said precursor on said substrate to form a ferroelectric layered superlattice material containing said metal on said first substrate.

2. A method as in claim 1 wherein said precursor liquid comprises a metal compound in a solvent, said metal compound selected from the group consisting of metal carboxylates and metal alkoxides.

3. A method as in claim 2 wherein said metal compound is selected from the group consisting of metal 2-ethylhexanoates and metal 2-methoxyethoxide.

4. A method as in claim 2 wherein said solvent has a boiling point between 110° C. and 170° C.

5. A method as in claim 4 wherein said solvent is selected from the group consisting of alcohols, aromatic hydrocarbons, and esters.

6. A method as in claim 2 wherein said solvent is selected from the group consisting of xylenes, 2-methoxyethanol, n-butyl acetate, 1,4-dioxane, methanol and methyl ethyl ketone.

7. A method as in claim 1 wherein said step of treating comprises a process selected from the group consisting of: exposing to vacuum, exposing to ultraviolet radiation, electrical poling, drying, heating, baking, rapid thermal processing, and annealing.

8. A method as in claim 7 wherein said step of treating includes a step of drying at a temperature of 250° C. or less.

9. A method as in claim 7 wherein said step of treating includes a step of baking at a temperature of between 200° C. and 600° C.

10. A method as in claim 7 wherein said step of treating includes a step of annealing at a temperature of 500° C. to 900° C.

11. A method as in claim 1 wherein said layered superlattice material comprises a dielectric material having a dielectric constant greater than 50.

12. A method as in claim 1 wherein said ferroelectric material is capable of switching polarization states $10^9$ times with less than 30% fatigue.

13. A method as in claim 1 wherein said layered superlattice material includes an A-site element, a B-site element, a superlattice generator element, and an anion, and said A-site element comprises one or more of the elements from the group consisting of strontium, calcium, barium, bismuth, cadmium, and lead.

14. A method as in claim 1 wherein said layered superlattice material includes an A-site element, a B-site element, a superlattice generator element, and an anion, and said B-site element comprises one or more elements from the group consisting of titanium, tantalum, hafnium, tungsten, niobium and zirconium.

15. A method as in claim 1 wherein said layered superlattice material includes an A-site element, a B-site element, a superlattice generator element, and an anion, and said superlattice generator element comprises one or more elements from the group consisting of bismuth, scandium, yttrium, lanthanum, antimony, chromium, and thallium.

16. A method as in claim 1 wherein said layered superlattice material includes an A-site element, a B-site element, a superlattice generator element, and an anion, and said anion comprises an element from the group consisting of oxygen, chlorine, fluorine, and hybrids thereof.

17. A method as in claim 1 wherein said layered superlattice material comprises a solid solution of two or more of said layered superlattice materials.

18. A method as in claim 1 wherein said layered superlattice material comprises a chemical compound selected from the group consisting of strontium bismuth tantalate, strontium bismuth niobate, strontium bismuth tantalum niobate, barium bismuth tantalate, lead bismuth tantalate, and barium bismuth niobate.

19. A method as in claim 18 wherein said precursor comprises 2%–80% excess quantity of an element in said chemical compound.

20. A method as in claim 19 wherein said element is selected from the group comprising lead, bismuth, thallium, and antimony.

21. A method as in claim 1 wherein said step of applying is performed at ambient temperature.

22. A method as in claim 1 wherein said substrate comprises an integrated circuit wafer.

23. A method as in claim 1 wherein said substrate comprises a support for a sputtering target.

24. A method as in claim 1 wherein said step of applying comprises spin-coating a layer of said precursor on said substrate.

25. A method as in claim 1 wherein:
said step of providing a substrate comprises placing a substrate inside an enclosed deposition chamber; and
said step of applying comprises the steps of: producing a mist of said liquid precursor, and flowing said mist through said deposition chamber to form a layer of the precursor liquid on said substrate.

26. The method of claim 25 wherein said step of flowing said mist into said deposition chamber is performed while maintaining a vacuum in the deposition chamber.

27. The method of claim 26 wherein said deposition chamber is maintained at a vacuum of between approximately 200 Torr and 800 Torr.

28. The method of claim 25 wherein said step of flowing comprises injecting said mist into said deposition chamber in close proximity to and around the periphery of one side of said substrate and exhausting said mist from said deposition chamber at a region in close proximity to and around the periphery of an opposite side of said substrate to create a substantially evenly distributed flow of mist across the substrate.

29. The method of claim 25 wherein a surface of said substrate defines a substrate plane and said mist is flowed between said substrate and a barrier plate located within said deposition chamber in a spaced relation to said substrate and parallel to said substrate plane.

30. The method of claim 29 wherein said barrier plate is adjustable to vary the distance between the barrier plate and the substrate.

31. The method of claim 29 including the additional step of rotating said substrate in a plane parallel to a surface of said substrate while said mist is flowing over said substrate.

32. The method of claim 25 including the additional step of applying ultraviolet radiation to said mist while the mist is flowing through the deposition chamber.

33. The method of claim 25 including the step of applying a DC bias between said deposition chamber and said substrate.

34. The method of claim 25 wherein said step of producing a mist comprises ultrasonically vibrating a quantity of said liquid precursor to form said mist by nebulization.

35. The method of claim 25 wherein said step of treating comprises maintaining a sub-atmospheric pressure in said deposition chamber.

36. The method of claim 25 wherein said step of providing a precursor includes the step of adding an initiator having a boiling point between 50° C. and 100° C. to said precursor prior to said step of producing a mist.

37. The method of claim 36 wherein said initiator comprises a solvent selected from the group consisting of methyl ethyl ketone, isopropanal, methanol, and tetrahydrofuran.

* * * * *